(12) United States Patent
Bao et al.

(10) Patent No.: US 9,954,191 B2
(45) Date of Patent: Apr. 24, 2018

(54) POLAR ELASTOMERS FOR HIGH PERFORMANCE ELECTRONIC AND OPTOELECTRONIC DEVICES

(71) Applicant: The Board of Trustees of the Leland Stanford Junior University, Stanford, CA (US)

(72) Inventors: Zhenan Bao, Stanford, CA (US); Chao Wang, Sunnyvale, CA (US); Wen Ya Lee, Palo Alto, CA (US); Guillaume Schweicher, Ixelles (BE); Desheng Kong, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 237 days.

(21) Appl. No.: 14/688,683

(22) Filed: Apr. 16, 2015

(65) Prior Publication Data
US 2017/0098791 A1  Apr. 6, 2017

Related U.S. Application Data

(60) Provisional application No. 61/980,390, filed on Apr. 16, 2014.

(51) Int. Cl.
*H01L 51/05* (2006.01)
*H01L 51/00* (2006.01)

(52) U.S. Cl.
CPC ........ *H01L 51/0516* (2013.01); *H01L 51/004* (2013.01); *H01L 51/0036* (2013.01); *H01L 51/0043* (2013.01)

(58) Field of Classification Search
None
See application file for complete search history.

(56) References Cited

U.S. PATENT DOCUMENTS

| 4,287,320 | A  | 9/1981 | Kolb |
| 6,852,416 | B2 | 2/2005 | Zhang et al. |
| 7,927,913 | B2 | 4/2011 | Kugler |
| 8,426,848 | B2 | 4/2013 | Mueller et al. |
| 2002/0122285 | A1 | 9/2002 | Aoki et al. |
| 2008/0020284 | A1 | 1/2008 | Michot et al. |
| 2008/0230773 | A1 | 9/2008 | Dickey et al. |

(Continued)

FOREIGN PATENT DOCUMENTS

WO    WO-2005/027216 A2    3/2005

OTHER PUBLICATIONS

Baeg et al., "Remarkable Enhancement of Hole Transport in TOP-Gated N-Type Polymer Field-Effect Transistors by a High-K Dielectric for Ambipolar Electronic Circuits," Advanced Materials, 24, pp. 5433-5439 (2012).

(Continued)

*Primary Examiner* — Michelle Mandala
(74) *Attorney, Agent, or Firm* — Foley & Lardner LLP; Cliff Z. Liu

(57) ABSTRACT

An electronic or optoelectronic device includes: (1) a semiconductor layer; (2) a pair of electrodes electrically coupled to the semiconductor layer; and (3) a dielectric layer in contact with the semiconductor layer and including a polar elastomer, where the elastomer has a glass transition temperature $T_g$ that is no greater than 25° C.

19 Claims, 17 Drawing Sheets

Light Emitting Diode 300

Solar cell 302

(56) References Cited

U.S. PATENT DOCUMENTS

| | | | |
|---|---|---|---|
| 2010/0067172 A1* | 3/2010 | Zhang | C08L 25/06 361/323 |
| 2010/0148232 A1 | 6/2010 | Ng et al. | |
| 2011/0069463 A1* | 3/2011 | Chen | H05K 1/145 361/782 |
| 2012/0107726 A1* | 5/2012 | Ogata | C08F 259/08 429/494 |
| 2012/0231379 A1 | 9/2012 | Nukada et al. | |
| 2012/0273976 A1 | 11/2012 | David et al. | |

OTHER PUBLICATIONS

Bauer-Gogonea et al., "High Dielectric Constant Fluorinated Polymer Film Gate Electrets for Organic Field Effect Transistors,"IEEE ISE-12, 2005 12$^{th}$ International Symposium on Electrets, Sep. 11-14, 2005, DOI 10.1109/ISE.2005.1612420, pp. 445-447 (2005).

Cho et al., "Printable Ion-Gel Gate Dielectrics for Low-Voltage Polymer Thin-Film Transistors on Plastic," Nature Materials 7, 900-906, doi:10.1038/nmat2291 (2008).

Fabiano et al., Ferroelectric Polarization Induces Electric Double Layer Bistability in Electrolyte-Gated Field-Effect Transistors ACS Applied Materials and Interfaces, 2014, 6(1), 438-442.

Halik et al., "Low-voltage organic transistors with an amorphous molecular gate dielectric," Nature 431, 963-966, doi:10.1038/nature02987 (2004).

Lee et al., "Ion Gel Gated Polymer Thin-Film Transistors," Journal of the American Chemical Society 129, 4532-4533, doi:10.1021/ja070875e (2007).

Lee et al., "Trap Healing and Ultralow-noise Hall Effect at the Surface of Organic Semiconductors," Nature Materials, pp. 1125-1129, DOI: 10.1038/nmat3781, (2013).

Li et al., "Solution Processable Low-Voltage Organic Thin Film Transistors with High-k Relaxor Ferroelectric Polymer as Gate Insulator," Advanced Materials, 24, pp. 88-93 (2012).

Mei et al., "Siloxane-Terminated Solubilizing Side Chains: Bringing Conjugated Polymer Backbones Closer and Boosting Hole Mobilities in Thin-Film Transistors," J. Am. Chem. Soc., 2011, 133 (50), pp. 20130-20133.

Ortiz et al., "High-k Organic, Inorganic, and Hybrid Dielectrics for Low-Voltage Organic Field-Effect Transistors," Chemical Reviews 110, 205-239, doi:10.1021/cr9001275 (2009).

Panzer et al., "Polymer Electrolyte Gate Dielectric Reveals Finite Windows of High Conductivity in Organic Thin Film Transistors at High Charge Carrier Densities," Journal of the American Chemical Society 127, 6960-6961, doi:10.1021/ja051579+ (2005).

Sakai et al., "Organic Field Effect Transistors with Dipole-Polarized Polymer Gate Dielectrics for Control of Threshold Voltage," Applied Physics Letters, 91(11), pp. 113502-2-113502-3, (2007).

Stadlober et al, "High-Mobility Pentacene Organic Field-effect Transistors with a High-dielectric-constant Fluorinated Polymer Film Gate Dielectric," Applied Physics Letters, 86, 242902 (2005).

Stadlober et al., "Transparent Pyroelectric Sensors and Organic Field-effect Transistors with Fluorinated Polymers: Steps Towards Organic Infrared Detectors," IEEE Transactions on Dielectrics and Electrical Insulation, 13(5), pp. 1087-x (2006).

Veres et al., "Insulators in Organic Field-Effect Transistors," Chemistry of Materials 16, 4543-4555, doi:10.1021/cm049598q (2004).

Yoshita et al., "Displacement Current Analysis of Carrier Behavior in Penacene Field Effect Transistor with Poly(vinylidene Fluoride and Tetrafluoroethylene) Gate Insulator," Journal of Applied Physics 106, pp. 024505-1-024505-4 (2009).

International Search Report and Written Opinion dated Dec. 28, 2015, from related international patent application PCT/US2015/026167.

Senanayak, S.P. et al. (2012) "Polarization fluctuation dominated electrical transport processes of polymer based ferroelectric-field-effect transistors," Physical Review B, Condensed Matter and Materials Physics 85(11):25 pages.

Extended European Search Report in EP Application No. 15814696.9, dated Oct. 25, 2017.

* cited by examiner

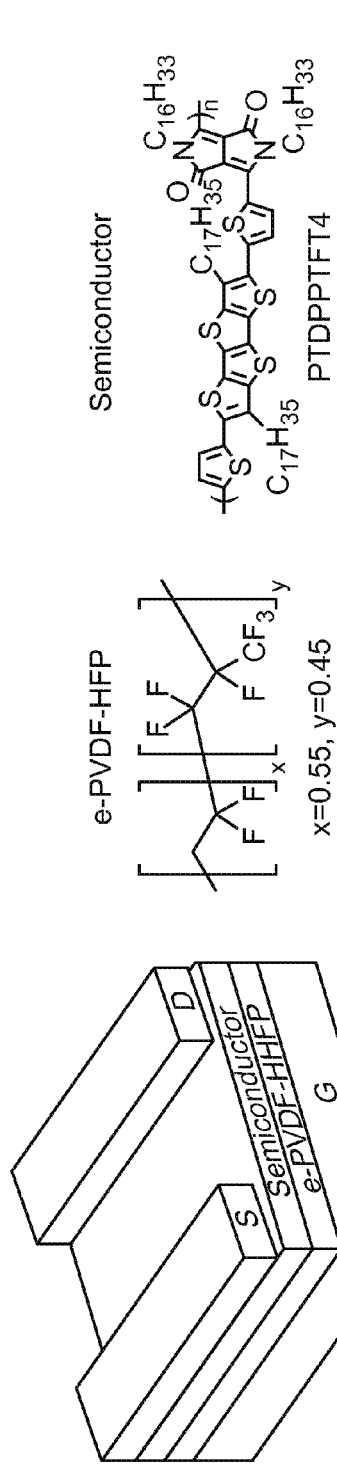
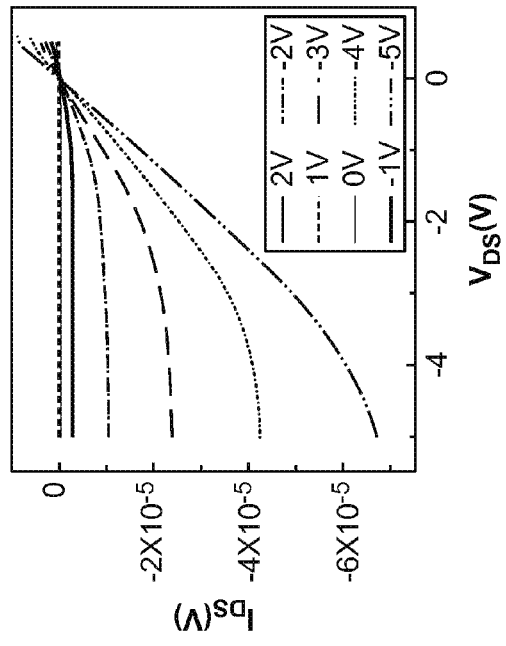
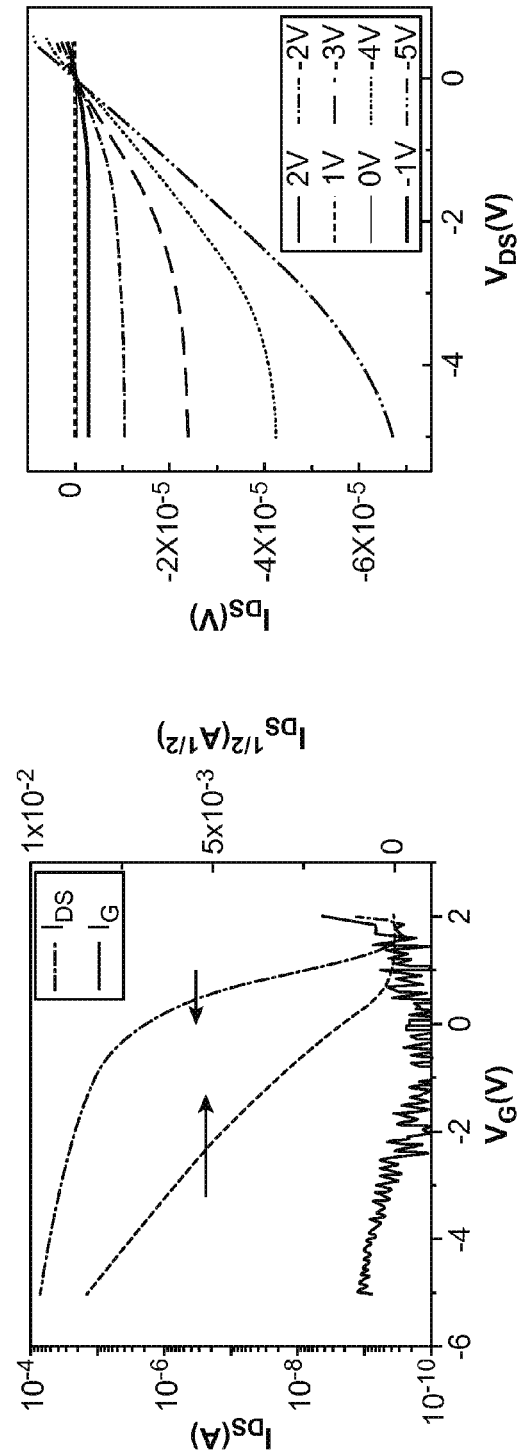
FIG. 4A
FIG. 4B
FIG. 4C

POLAR ELASTOMERS FOR HIGH PERFORMANCE ELECTRONIC AND OPTOELECTRONIC DEVICES

CROSS-REFERENCE TO RELATED APPLICATION

This application claims the benefit of U.S. Provisional Application No. 61/980,390, filed on Apr. 16, 2014, the content of which is incorporated herein by reference in its entirety.

STATEMENT REGARDING FEDERALLY SPONSORED RESEARCH OR DEVELOPMENT

This invention was made with Government support under contract FA9550-12-1-0190 awarded by the Air Force Office of Scientific Research. The Government has certain rights in the invention.

TECHNICAL FIELD

This disclosure generally relates to polar elastomers and their use in electronic and optoelectronic devices.

BACKGROUND

Field-effect transistors (FETs) with both high gain and high transconductance are desirable for a broad range of applications, including logic circuits, display drivers and sensing. High-performance FETs based on organic semiconductors, namely organic FETs (OFETs), are of particular interest due to their compatibility with low-cost, high-throughput manufacturing processes and mechanical compliance with soft tissues. However, it has been challenging to realize high transconductance with organic semiconductors due to their relatively low charge carrier mobilities. To address these challenges, attempts have been made to develop dielectric layers with high capacitances, such as using an ultra-thin, self-assembled monolayer (SAM), ion-doped polymer electrolytes and ionic gel electrolytes as dielectric layers for OFETs. However, challenges remain in using the aforementioned dielectric layers for practical applications due to the low yield of SAM fabrication, incompatibility of liquid/gel materials with standard manufacturing processes and the high moisture sensitivity of ionic dielectric materials.

It is against this background that a need arose to develop the embodiments described herein.

SUMMARY

One aspect of this disclosure relates to an electronic or optoelectronic device. In some embodiments, the device includes: (1) a semiconductor layer; (2) a pair of electrodes electrically coupled to the semiconductor layer; and (3) a dielectric layer in contact with the semiconductor layer and including a polar elastomer, where the elastomer has a glass transition temperature $T_g$ that is no greater than 25° C.

In additional embodiments, the device includes: (1) a semiconductor layer; (2) a pair of electrodes electrically coupled to the semiconductor layer; and (3) a dielectric layer in contact with the semiconductor layer and including a polar elastomer, where the elastomer includes ions and has an ionic conductivity no greater than $1 \times 10^{-6}$ S/cm.

In further embodiments, the device is a transistor, which includes: (1) a semiconductor layer; (2) a drain electrode electrically coupled to the semiconductor layer; (3) a source electrode electrically coupled to the semiconductor layer; (4) a gate electrode; and (5) a gate dielectric layer, where the gate dielectric layer is disposed between the gate electrode and the semiconductor layer, and the gate dielectric layer includes a polar elastomer having a glass transition temperature $T_g$ that is no greater than 25° C. and having an ionic conductivity of at least $1 \times 10^{-12}$ S/cm and up to $1 \times 10^{-6}$ S/cm.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

FIG. 4A: Chemical structure, device structure schematic and characterization of polar elastomeric poly(vinylidene fluoride-co-hexafluoropropylene) (e-PVDF-HFP) films. a, Transistor device structure and chemical structures of e-PVDF and poly(tetrathienoacene-diketopyrrolopyrrole) (PTDPPTFT4). FIGS. 4B and 4C: Output and transfer characteristics of PTDPPTFT4 (channel length L=about 50 μm, channel width W=about 1,000 μm), where $V_{DS}$=about −5 V. The thickness of the dielectric is about 1.4 μm. Two slopes in the $I_{DS}^{1/2}$ vs. $V_G$ plot were observed. This may be attributed to the existence of contact resistance in the device. The first slope in the range of about +0.2 V to about −2 V is used to estimate mobility values.

FIG. 5A: Transfer curves of organic thin-film transistors (OTFTs) prepared on e-PVDF-HFP dielectric layer with varying thicknesses. FIG. 5B: Corresponding field-effect mobility as a function of the thickness of e-PVDF-HFP determined by using capacitance at about 20 Hz, about 0.1 Hz and quasi-static values. The adoption of capacitance at about 20 Hz gives rise to underestimation of the actual charge carrier density during transfer characteristic measurements and therefore inflated mobility values. FIG. 5C: Device characteristics in forward and reverse sweep. FIG. 5D: Temperature-dependent transconductance of PTDPPTFT4 field-effect transistors (FETs) formed on e-PVDF-HFP (solid trace) and octadecyltrichlorosilane (OTS)-modified $SiO_2$ (dotted trace). FIG. 5E: Transfer curves of OTFTs formed on c-PVDF-HFP dielectric layer with varying thicknesses. FIG. 5F: Corresponding field-effect mobility as a function of the thickness of c-PVDF-HFP determined by using capacitance at about 20 Hz and quasi-static values.

FIG. 6D: Transconductance comparison between different dielectrics. All the transconductances were normalized to a driven gate voltage of about −3 V. The black dots show the transconductances obtained from OFETs based on common dielectric layers, including cross-linked Cytop (thickness=about 50-70 nm), cross-linked polystyrene (PS) (thickness=about 10 nm), cross-linked poly(vinyl phenyl) (PVP) (thickness=about 280 nm), $SiO_2$ (thickness=about 230-300 nm) and semi-crystalline PVDF-HFP (thickness=about 1.4 µm). Note that all $SiO_2$ dielectrics were modified by OTS self-assembled monolayers (SAMs). The dots to the right of the dashed vertical line represent the performance obtained from OFETs based on e-PVDF-HFP. The transconductances of all the e-PVDF-HFP devices are about one order of magnitude higher than the same materials made on OTS-modified $SiO_2$. FIG. 6E: $I_{DS}$ and $I_G$ currents versus frequency of a PTDPPTFT4 transistor with e-PVDF-HFP as a dielectric layer (L=about 50 µm, W=about 1,000 µm), where $V_{DS}$=about −15 V, $V_G$=about 10 V to about −10 V. The cut-off frequency ($f_c$) was estimated based on the intersection of $I_{DS}$ and $I_G$. FIG. 6F: $I_{DS}$ response of PTDPPTFT4 to a square wavefunction gate-voltage pulse at about 1 kHz, pulse width=about 1 ms, pulse rise time=about 4 µs, and channel length=about 50 µm. The response time is specified as the time for reaching 80% of the maximum on-current from 20% off.

FIG. 7A: Bias stress behavior ($I_{DS}$ vs. time) for PTDPPTFT4 FETs under $V_G$=about −0.5, about −1, about −3 and about −5 V in ambient conditions. FIG. 7B: Long-term bias on current $I_D$ and leakage current $I_G$ measured at the end of each bias cycle in air (solid symbols) and in de-ionized (DI) water (open symbols). A bias of $V_D$=$V_G$=about −0.5 V was applied, and transfer characteristics were measured before and immediately after each bias step. FIGS. 7C and 7D: Evolution of mobility and shift of threshold voltage in both the linear and saturation regimes during long-term bias in air and DI water, respectively. The field-effect mobility was calculated with the quasi-static capacitance. The decrease of mobility was analyzed by performing a linear regression in time, exhibiting a slope of about −0.22%/hour and about −0.25%/hour, for the device in air and DI water, respectively. Interruptions in the plots are the start of a new measurement cycle and refilling a syringe pump in case of the device exposed to DI water.

FIG. 8A: Differential scanning calorimetry (DSC) traces of e-PVDF-HFP and semi-crystalline PVDF-HFP polymers. The lack of a melting peak, characteristic of a semi-crystalline polymer, indicates the formation of an amorphous material when increasing a molar fraction of HFP units to about 45%. The fraction of VDF and HFP units in e-PVDF-HFP was calculated from a total fluorine weight percentage (about 65.9%). FIG. 8B: Stress-strain cycling of tests of e-PVDF-HFP. e-PVDF-HFP shows elastic behavior up to about 50% strain and maintains some elasticity up to about 100% strain. Significant plastic deformations began to occur beyond about 100% strain and resulted in fracture of the material at about 150% strain.

FIG. 9A: $^1$H NMR of the e-PVDF-HFP. The percentage of a cross-linker was calculated through integration of the protons on VDF (arrow) and the cross-linker (circle). The amount of the cross-linker was calculated to be about 1 mol. %. FIG. 9B: $^{19}$F NMR of a semi-crystalline PVDF-HFP; the molar fraction of the HFP unit was calculated to be about 10%. FIG. 9C: Atomic force microscopy (AFM) image of a surface morphology of an e-PVDF-HFP film with a thickness of about 1.4 µm.

FIG. 10A: Density functional theory (DFT) hybrid functional calculations of a charge density distribution and optimized geometry of e-PVDF-HFP. Calculations of the charge density distribution, total dipole moment and optimized geometry of PVDF-HFP have been carried out using a B3LYP/6-31G(d) basis set DFT hybrid functional with Gaussian-09 software. From the calculations, it is observed that there are large polarizations along the PVDF-HFP backbone. This leads to distinct local dipole moments on the polymer chain with the most polarized regions corresponding to junctions between the VDF and HFP units. FIG. 10B: The energy of a molecule was calculated as a function of a dihedral angle between atoms labeled 2C and 16C (arrows in the figure) (rotation along the 12C¬13C bond). The total dipole moment and structure energy calculations were carried out using a B3LYP/6-31G(d) basis set DFT hybrid functional with Gaussian-09 software. The optimized geometry of PVDF-HFP was used as a starting point for this coordinate scan. From the calculations, it is observed that strong local dipoles are present at the VDF and HFP intersections at most favorable rotations of the VDF-HFP bond.

FIG. 11A: The capacitance values of e-PVDF-HFP at about 20 Hz, about 0.1 Hz and quasi-static capacitance determined by charging/discharging of a RC circuit. The capacitance values at about 20 Hz are inversely proportional to the thickness of the dielectric layer, which represents a regular charging process of the dielectric layer. The values at a low frequency of about 0.1 Hz, which approaches the static limit, do not exhibit dependence on the dielectric layer thickness due to an electric double-layer charging process. The results are consistent with the quasi-static capacitance based on charging/discharging of a RC circuit. FIG. 11B: The capacitance of c-PVDF-HFP at about 20 Hz exhibits a trend to be inversely proportional to its thickness, which is very close to the quasi-static capacitance. FIG. 11C: The capacitance of PDMS at about 20 Hz is inversely proportional to its thickness.

FIG. 12A: P3HT ($V_{DS}$=about −5 V) FIG. 12B: PII2T ($V_{DS}$=about −10 V) FIG. 12C: PCBM ($V_{DS}$=about +7 V) FIG. 12D: Output characteristics of OTFTs based on PCBM.

FIG. 12E: The curve of gate leakage current vs. voltage measured in the device of Au/e-PVDF-HFP/aluminum (Al) with about 1.4 µm-thick e-PVDF-HFP layer.

FIGS. 15A and 15D: Schematic illustration of the measurement setup. A Keithley SourceMeter model 2400 was used to charge the circuit. A Keithley SourceMeter model 2635A was used as a voltmeter. For the charging cycle, an electrical resistance of 500±50 MΩ was connected in series with the K2400 meter, while for the discharging cycle the resistor was connected in parallel. FIGS. 15B and 15E: Measured voltage drop on the capacitance sample with applied voltages $U_0$=about 0.25, about 0.5, about 0.75, about 1, about 1.25, about 1.5, about 1.75 and about 2 V. FIGS. 15C and 15F: Calculated gate-capacitance for charging and discharging of a typical device based on e-PVDF-HFP with a thickness of about 1.4 µm exhibiting $C_i$=287±31 nF/cm².

FIG. 16A: Schematic of a transistor device structure. The device adopts a bottom-contact, bottom-gate structure. The source/drain electrodes formed of chromium (Cr)/Au (about 5 nm/about 40 nm) are pre-patterned on the PDMS dielectric layer with varying thicknesses, followed by a transfer process to laminate an organic semiconductor onto the electrodes with the assistance of an about 5 mm thick PDMS substrate. This process is used because of swelling issues with PDMS when an organic semiconductor is directly spun on PDMS. FIG. 16B: Transfer curves of OTFTs as a function of the thickness of the PDMS dielectric layer. FIG. 16C: The mobility decreases as the thickness of PDMS increases. The higher mobility observed in devices with a thinner dielectric layer is ascribed to an effective filling of traps at a high charge carrier density.

FIG. 17A: Output and FIG. 17B: transfer characteristics of PTDPPTFT4, where channel length=about 100 µm and channel width=about 2,000 µm.

FIG. 18A: Output and FIG. 18B: transfer characteristics ($V_{DS}$=about −80 V), where channel length=about 50 µm and channel width=about 1,000 µm. Capacitance of the semi-crystalline PVDF-HFP (about 1.5 µm in thickness) was measured in an inert atmosphere. A high gate voltage of about −60 V was applied for a comparable on-current of about $10^{-4}$ A as a device fabricated on e-PVDF-HFP (about 1.4 µm). The calculated mobility from the saturation regime was 0.38±0.03 cm² V⁻¹ s⁻¹. The $I_{ON}/I_{OFF}$ and $V_{TH}$ were about $3\times10^5$ and 0±4 V, respectively.

FIG. 19A: Grazing incidence X-ray diffraction (GIXD) pattern of PTDPPTFT4 on an OTS-modified SiO₂ dielectric layer. FIG. 19B: GIXD pattern of PTDPPTFT4 on ePVDF-HFP. FIG. 19C: Azimuthal X-ray diffraction (XRD) profiles at $Q_z$= (200) diffraction peak of PTDPPTFT4 thin films on OTS-modified SiO₂ and ePVDF-HFP, respectively. Compared to films on OTS-modified SiO₂, the PTDPPTFT4 films on e-PVDF-HFP presented much narrower diffraction peaks, which indicates that the organic semiconductor possessed a larger crystalline size on the surface of e-PVDF-HFP. Additionally, it is observed that the π-π (stacking distance is reduced from about 3.695 Å to about 3.660 Å on e-PVDF-HFP, and the lamella stacking distance increased from about 25.510 Å to about 26.658 Å.

FIG. 20A: Transfer curves of PTDPPTFT4 FETs operated at different temperatures. FIG. 20B: Transfer curves of PTDPPTFT4 FETs measured with and without a continuously applied gate bias of about −5 V during cooling. Note that applying a gate bias in an accumulation mode on the device during cooling down resulted in a high off-current. This result may be due to a low ion mobility at a low temperature (below $T_g$ of the polymer).

DETAILED DESCRIPTION

Definitions

Figure 1A:
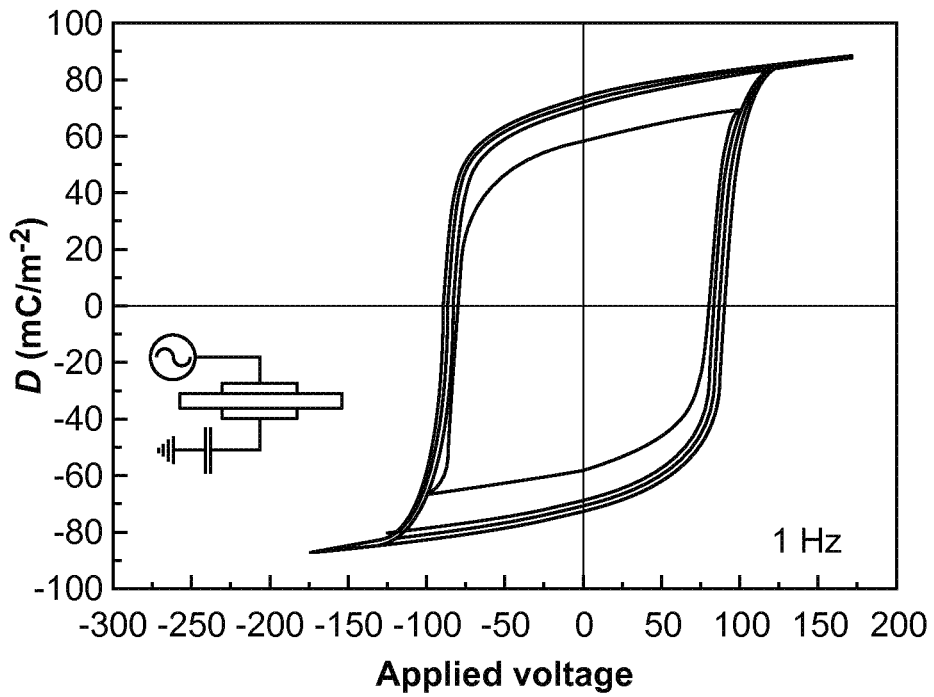
FIG. 1A: Typical polarization-voltage curve of a ferroelectric polymer, measured by applying a time-varying voltage across a layer of the ferroelectric polymer through a pair of electrodes sandwiching the layer of the ferroelectric polymer.

The following definitions apply to some of the aspects described with regard to some embodiments of this disclosure. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set can also be referred to as members of the set. Objects of a set can be the same or different. In some instances, objects of a set can share one or more common characteristics.

As used herein, the terms "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, relative terms, such as "exterior," "inner," "outer," "top," "upper," "upwardly," "lower," "bottom," "downwardly," "lateral," and "laterally," refer to an orientation of a set of objects with respect to one another, such as in accordance with the drawings, but do not require a particular orientation of those objects during manufacturing or use.

As used herein, the terms "optional" and "optionally" mean that the subsequently described event or circumstance may or may not occur and that the description includes instances where the event or circumstance occurs and instances in which it does not.

As used herein, the terms "couple," "coupled," and "coupling" refer to an operational connection or linking coupled objects can be directly connected to one another or can be indirectly connected to one another, such as through another set of objects.

As used herein, the term "nanometer range" or "nm range" refers to a range of dimensions from about 1 nanometer (nm) to about 1 micrometer (μm). The nm range includes the "lower nm range," which refers to a range of dimensions from about 1 nm to about 10 nm, the "middle nm range," which refers to a range of dimensions from about 10 nm to about 100 nm, and the "upper nm range," which refers to a range of dimensions from about 100 nm to about 1 μm.

As used herein, the term "micrometer range" or "μm range" refers to a range of dimensions from about 1 μm to about 1 millimeter (mm). The μm range includes the "lower μm range," which refers to a range of dimensions from about 1 μm to about 10 μm, the "middle μm range," which refers to a range of dimensions from about 10 μm to about 100 μm, and the "upper μm range," which refers to a range of dimensions from about 100 μm to about 1 mm.

As used herein, the term "aspect ratio" refers to a ratio of a largest dimension or extent of an object and an average of remaining dimensions or extents of the object, where the remaining dimensions can be substantially orthogonal with respect to one another and with respect to the largest dimension. In some instances, remaining dimensions of an object can be substantially the same, and an average of the remaining dimensions can substantially correspond to either of the remaining dimensions. For example, an aspect ratio of a cylinder refers to a ratio of a length of the cylinder and a cross-sectional diameter of the cylinder. As another example, an aspect ratio of a spheroid refers to a ratio of a dimension along a major axis of the spheroid and a dimension along a minor axis of the spheroid.

As used herein, the term "nanostructure" refers to an object that has at least one dimension in the nm range. A nanostructure can have any of a wide variety of shapes, and can be formed of a wide variety of materials. Examples of nanostructures include nanowires, nanotubes, and nanoparticles.

As used herein, the term "nanowire" refers to an elongated, nanostructure that is substantially solid. Typically, a nanowire has a lateral dimension (e.g., a cross-sectional dimension in the form of a width, a diameter, or a width or diameter that represents an average across orthogonal directions) in the nm range, a longitudinal dimension (e.g., a length) in the μm range, and an aspect ratio that is about 3 or greater.

As used herein, the term "nanotube" refers to an elongated, hollow, nanostructure. Typically, a nanotube has a lateral dimension (e.g., a cross-sectional dimension in the form of a width, an outer diameter, or a width or outer diameter that represents an average across orthogonal directions) in the nm range, a longitudinal dimension (e.g., a length) in the μm range, and an aspect ratio that is about 3 or greater.

As used herein, the term "nanoparticle" refers to a spheroidal nanostructure. Typically, each dimension (e.g., a cross-sectional dimension in the form of a width, a diameter, or a width or diameter that represents an average across orthogonal directions) of a nanoparticle is in the nm range, and the nanoparticle has an aspect ratio that is less than about 3, such as about 1.

As used herein, the term "group" refers to a set of atoms that form a portion of a molecule. In some instances, a group can include two or more atoms that are bonded to one another to form a portion of a molecule. A group can be monovalent or polyvalent to allow bonding to one or more additional groups of a molecule. For example, a monovalent group can be envisioned as a molecule with one of its hydrogen atoms removed to allow bonding to another group of a molecule. A group can be neutral, positively charged, or negatively charged. For example, a positively charged group can be envisioned as a neutral group with one or more protons (i.e., $H^+$) added, and a negatively charged group can be envisioned as a neutral group with one or more protons removed. Examples of groups include those set forth in the following.

As used herein, the term "alkane" refers to a saturated hydrocarbon molecule. For certain implementations, an alkane can include from 1 to 100 carbon atoms. The term "lower alkane" refers to an alkane that includes from 1 to 20 carbon atoms, such as from 1 to 10 carbon atoms, while the term "upper alkane" refers to an alkane that includes more than 20 carbon atoms, such as from 21 to 100 carbon atoms. The term "branched alkane" refers to an alkane that includes a set of branches, while the term "unbranched alkane" refers to an alkane that is straight-chained. The term "cycloalkane" refers to an alkane that includes a set of ring structures, such as a single ring structure or a bicyclo or higher order cyclic structure. The term "heteroalkane" refers to an alkane that has a set of its carbon atoms replaced by a set of heteroatoms, such as N, Si, S, O, and P. The term "substituted alkane" refers to an alkane that has a set of its hydrogen atoms replaced by a set of substituent groups, while the term "unsubstituted alkane" refers to an alkane that lacks such replacement. Combinations of the above terms can be used to refer to an alkane having a combination of characteristics. For example, the term "branched lower alkane" can be used to refer to an alkane that includes from 1 to 20 carbon atoms and a set of branches.

As used herein, the term "alkyl group" refers to a monovalent form of an alkane. For example, an alkyl group can be envisioned as an alkane with one of its hydrogen atoms removed to allow bonding to another group of a molecule. The term "lower alkyl group" refers to a monovalent form of a lower alkane, while the term "upper alkyl group" refers to a monovalent form of an upper alkane. The term "branched alkyl group" refers to a monovalent form of a branched alkane, while the term "unbranched alkyl group" refers to a monovalent form of an unbranched alkane. The term "cycloalkyl group" refers to a monovalent form of a cycloalkane, and the term "heteroalkyl group" refers to a monovalent form of a heteroalkane. The term "substituted alkyl group" refers to a monovalent form of a substituted alkane, while the term "unsubstituted alkyl group" refers to a monovalent form of an unsubstituted alkane. Examples of alkyl groups include methyl, ethyl, n-propyl, isopropyl, cyclopropyl, n-butyl, s-butyl, isobutyl, t-butyl, cyclobutyl, n-pentyl, 1-adamantyl, 2-pinenyl, and charged, hetero, or substituted forms thereof.

As used herein, the term "alkylene group" refers to a bivalent form of an alkane. For example, an alkylene group can be envisioned as an alkane with two of its hydrogen atoms removed to allow bonding to one or more additional groups of a molecule. The term "lower alkylene group" refers to a bivalent form of a lower alkane, while the term "upper alkylene group" refers to a bivalent form of an upper alkane. The term "branched alkylene group" refers to a bivalent form of a branched alkane, while the term "unbranched alkylene group" refers to a bivalent form of an unbranched alkane. The term "cycloalkylene group" refers to a bivalent form of a cycloalkane, and the term "heteroalkylene group" refers to a bivalent form of a heteroalkane. The term "substituted alkylene group" refers to a bivalent form of a substituted alkane, while the term "unsubstituted alkylene group" refers to a bivalent form of an unsubstituted alkane. Examples of alkylene groups include methylene, ethylene, propylene, 2-methylpropylene, and charged, hetero, or substituted forms thereof.

As used herein, the term "alkene" refers to an unsaturated hydrocarbon molecule that includes a set of carbon-carbon double bonds. For certain implementations, an alkene can include from 2 to 100 carbon atoms. The term "lower alkene" refers to an alkene that includes from 2 to 20 carbon atoms, such as from 2 to 10 carbon atoms, while the term "upper alkene" refers to an alkene that includes more than 20 carbon atoms, such as from 21 to 100 carbon atoms. The term "cycloalkene" refers to an alkene that includes a set of ring structures, such as a single ring structure or a bicyclo or higher order cyclic structure. The term "heteroalkene" refers to an alkene that has a set of its carbon atoms replaced by a set of heteroatoms, such as N, Si, S, O, and P. The term "substituted alkene" refers to an alkene that has a set of its hydrogen atoms replaced by a set of substituent groups, while the term "unsubstituted alkene" refers to an alkene that lacks such replacement. Combinations of the above terms can be used to refer to an alkene having a combination of characteristics. For example, the term "substituted lower alkene" can be used to refer to an alkene that includes from 1 to 20 carbon atoms and a set of substituent groups.

As used herein, the term "alkenyl group" refers to a monovalent form of an alkene. For example, an alkenyl group can be envisioned as an alkene with one of its hydrogen atoms removed to allow bonding to another group of a molecule. The term "lower alkenyl group" refers to a monovalent form of a lower alkene, while the term "upper alkenyl group" refers to a monovalent form of an upper alkene. The term "cycloalkenyl group" refers to a monovalent form of a cycloalkene, and the term "heteroalkenyl group" refers to a monovalent form of a heteroalkene. The term "substituted alkenyl group" refers to a monovalent form of a substituted alkene, while the term "unsubstituted alkenyl group" refers to a monovalent form of an unsubstituted alkene. Examples of alkenyl groups include ethenyl, 2-propenyl (i.e., allyl), isopropenyl, cyclopropenyl, butenyl, isobutenyl, t-butenyl, cyclobutenyl, and charged, hetero, or substituted forms thereof.

As used herein, the term "alkenylene group" refers to a bivalent form of an alkene. For example, an alkenylene group can be envisioned as an alkene with two of its hydrogen atoms removed to allow bonding to one or more additional groups of a molecule. The term "lower alkenylene group" refers to a bivalent form of a lower alkene, while the term "upper alkenylene group" refers to a bivalent form of an upper alkene. The term "cycloalkenylene group" refers to a bivalent form of a cycloalkene, and the term "heteroalkenylene group" refers to a bivalent form of a heteroalkene. The term "substituted alkenylene group" refers to a bivalent form of a substituted alkene, while the term "unsubstituted alkenylene group" refers to a bivalent form of an unsubstituted alkene. Examples of alkenylene groups include ethenylene, propenylene, 2-methylpropenylene, and charged, hetero, or substituted forms thereof.

As used herein, the term "alkyne" refers to an unsaturated hydrocarbon molecule that includes a set of carbon-carbon triple bonds. In some instances, an alkyne can also include a set of carbon-carbon double bonds. For certain implementations, an alkyne can include from 2 to 100 carbon atoms. The term "lower alkyne" refers to an alkyne that includes from 2 to 20 carbon atoms, such as from 2 to 10 carbon atoms, while the term "upper alkyne" refers to an alkyne that includes more than 20 carbon atoms, such as from 21 to 100 carbon atoms. The term "cycloalkyne" refers to an alkyne that includes a set of ring structures, such as a single ring structure or a bicyclo or higher order cyclic structure. The term "heteroalkyne" refers to an alkyne that has a set of its carbon atoms replaced by a set of heteroatoms, such as N, Si, S, O, and P. The term "substituted alkyne" refers to an alkyne that has a set of its hydrogen atoms replaced by a set of substituent groups, while the term "unsubstituted alkyne" refers to an alkyne that lacks such replacement. Combinations of the above terms can be used to refer to an alkyne having a combination of characteristics. For example, the term "substituted lower alkyne" can be used to refer to an alkyne that includes from 1 to 20 carbon atoms and a set of substituent groups.

As used herein, the term "alkynyl group" refers to a monovalent form of an alkyne. For example, an alkynyl group can be envisioned as an alkyne with one of its hydrogen atoms removed to allow bonding to another group of a molecule. The term "lower alkynyl group" refers to a monovalent form of a lower alkyne, while the term "upper alkynyl group" refers to a monovalent form of an upper alkyne. The term "cycloalkynyl group" refers to a monovalent form of a cycloalkyne, and the term "heteroalkynyl group" refers to a monovalent form of a heteroalkyne. The term "substituted alkynyl group" refers to a monovalent form of a substituted alkyne, while the term "unsubstituted alkynyl group" refers to a monovalent form of an unsubstituted alkyne. Examples of alkynyl groups include ethynyl, propynyl, isopropynyl, butynyl, isobutynyl, t-butynyl, and charged, hetero, or substituted forms thereof.

As used herein, the term "alkynylene group" refers to a bivalent form of an alkyne. For example, an alkynylene group can be envisioned as an alkyne with two of its hydrogen atoms removed to allow bonding to one or more additional groups of a molecule. The term "lower alkynylene group" refers to a bivalent form of a lower alkyne, while the term "upper alkynylene group" refers to a bivalent form of an upper alkyne. The term "cycloalkynylene group" refers to a bivalent form of a cycloalkyne, and the term "heteroalkynylene group" refers to a bivalent form of a heteroalkyne. The term "substituted alkynylene group" refers to a bivalent form of a substituted alkyne, while the term "unsubstituted alkynylene group" refers to a bivalent form of an unsubstituted alkyne. Examples of alkynylene groups include ethynylene, propynylene, 1-butynylene, 1-buten-3-ynylene, and charged, hetero, or substituted forms thereof.

As used herein, the term "arene" refers to an aromatic hydrocarbon molecule. For certain implementations, an arene can include from 5 to 100 carbon atoms. The term "lower arene" refers to an arene that includes from 5 to 20 carbon atoms, such as from 5 to 14 carbon atoms, while the term "upper arene" refers to an arene that includes more than 20 carbon atoms, such as from 21 to 100 carbon atoms. The term "monocyclic arene" refers to an arene that includes a single aromatic ring structure, while the term "polycyclic arene" refers to an arene that includes more than one aromatic ring structure, such as two or more aromatic ring structures that are bonded via a carbon-carbon bond or that are fused together. The term "heteroarene" refers to an arene that has a set of its carbon atoms replaced by a set of heteroatoms, such as N, Si, S, O, and P. The term "substituted arene" refers to an arene that has a set of its hydrogen atoms replaced by a set of substituent groups, while the term "unsubstituted arene" refers to an arene that lacks such replacement. Combinations of the above terms can be used to refer to an arene having a combination of characteristics. For example, the term "monocyclic lower alkene" can be used to refer to an arene that includes from 5 to 20 carbon atoms and a single aromatic ring structure.

As used herein, the term "aryl group" refers to a monovalent form of an arene. For example, an aryl group can be envisioned as an arene with one of its hydrogen atoms removed to allow bonding to another group of a molecule. The term "lower aryl group" refers to a monovalent form of a lower arene, while the term "upper aryl group" refers to a monovalent form of an upper arene. The term "monocyclic aryl group" refers to a monovalent form of a monocyclic arene, while the term "polycyclic aryl group" refers to a monovalent form of a polycyclic arene. The term "heteroaryl group" refers to a monovalent form of a heteroarene. The term "substituted aryl group" refers to a monovalent form of a substituted arene, while the term "unsubstituted aryl group" refers to a monovalent form of an unsubstituted arene. Examples of aryl groups include phenyl, biphenylyl, naphthyl, pyridinyl, pyridazinyl, pyrimidinyl, pyrazinyl, quinolyl, isoquinolyl, and charged, hetero, or substituted forms thereof.

As used herein, the term "hydride group" refers to —H.

As used herein, the term "halogen group" refers to —X, where X is a halogen atom. Examples of halogen groups include fluoro, chloro, bromo, and iodo.

As used herein, the term "hydroxyl group" refers to —OH.

As used herein, the term "thio group" refers to —SH.

As used herein, the term "cyano group" refers to —CN.

As used herein, the term "nitro group" refers to —NO$_2$.

As used herein, the term "amino group" refers to —NH$_2$.

As used herein, the term "N-substituted amino group" refers to an amino group that has a set of its hydrogen atoms replaced by a set of substituent groups. Examples of N-substituted amino groups include —NRR', where R and R' are selected from hydride groups, alkyl groups, alkenyl groups, alkynyl groups, and aryl groups, and at least one of R and R' is not a hydride group.

As used herein, the term "ammonium group" refers to —NH$_3^+$.

As used herein, the term "N-substituted ammonium group" refers to an ammonium group that has a set of its hydrogen atoms replaced by a set of substituent groups. Examples of N-substituted ammonium groups include —NR"R'R$^+$, where R, R', and R" are selected from hydride groups, alkyl groups, alkenyl groups, alkynyl groups, and aryl groups, and at least one of R, R', and R" is not a hydride group.

As used herein, the term "amide group" refers to —(C=O)NH$_2$.

As used herein, the term "N-substituted amide group" refers to an amide group that has a set of its hydrogen atoms replaced by a set of substituent groups. Examples of N-substituted amide groups include —(C=O)NRR', where R and R' are selected from hydride groups, alkyl groups, alkenyl groups, alkynyl groups, and aryl groups, and at least one of R and R' is not a hydride group.

As used herein, the term "carboxy group" refers to —(C=O)OH.

As used herein, the term "alkylcarbonyloxy group" refers to —O(C=O)R, where R is an alkyl group.

As used herein, the term "alkenylcarbonyloxy group" refers to —O(C=O)R, where R is an alkenyl group.

As used herein, the term "alkynylcarbonyloxy group" refers to —O(C=O)R, where R is an alkynyl group.

As used herein, the term "arylcarbonyloxy group" refers to —O(C=O)R, where R is an aryl group.

As used herein, the term "alkylcarbonylamino group" refers to —NH(C=O)R, where R is an alkyl group.

As used herein, the term "N-substituted alkylcarbonylamino group" refers to an alkylcarbonylamino group that has its hydrogen atom, which is bonded to its nitrogen atom, replaced by a substituent group. Examples of N-substituted alkylcarbonylamino groups include —NR(C=O)R', where R is selected from alkyl groups, alkenyl groups, alkynyl groups, and aryl groups, and R' is an alkyl group.

As used herein, the term "alkenylcarbonylamino group" refers to —NH(C=O)R, where R is an alkenyl group.

As used herein, the term "N-substituted alkenylcarbonylamino group" refers to an alkenylcarbonylamino group that has its hydrogen atom, which is bonded to its nitrogen atom, replaced by a substituent group. Examples of N-substituted alkenylcarbonylamino groups include —NR(C=O)R', where R is selected from alkyl groups, alkenyl groups, alkynyl groups, and aryl groups, and R' is an alkenyl group.

As used herein, the term "alkynylcarbonylamino group" refers to —NH(C=O)R, where R is an alkynyl group.

As used herein, the term "N-substituted alkynylcarbonylamino group" refers to an alkynylcarbonylamino group that has its hydrogen atom, which is bonded to its nitrogen atom, replaced by a substituent group. Examples of N-substituted alkynylcarbonylamino groups include —NR(C=O)R', where R is selected from alkyl groups, alkenyl groups, alkynyl groups, and aryl groups, and R' is an alkynyl group.

As used herein, the term "arylcarbonylamino group" refers to —NH(C=O)R, where R is an aryl group.

As used herein, the term "N-substituted arylcarbonylamino group" refers to an arylcarbonylamino group that has its hydrogen atom, which is bonded to its nitrogen atom, replaced by a substituent group. Examples of N-substituted arylcarbonylamino groups include —NR(C=O)R', where R is selected from alkyl groups, alkenyl groups, alkynyl groups, and aryl groups, and R' is an aryl group.

As used herein, the term "urea group" refers to —NH(C=O)NH$_2$.

As used herein, the term "epoxy group" refers to:

As used herein, the term "oxazolidone group" refers to:

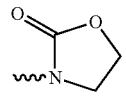

and variants where positions of N and O atoms are changed within the ring structure.

As used herein, the term "fullerene" refers to a set of carbon cage molecules. For certain implementations, a fullerene molecule can include a three-dimensional skeleton that includes multiple carbon atoms, and that forms a closed shell, which can be spherical or semi-spherical in shape. Carbon atoms of a fullerene molecule typically are bonded to three nearest-neighbors arranged in a tetrahedral geometry. A fullerene molecule can be designated as $C_n$, where n is an integer corresponding to the number of carbon atoms included in a carbon skeleton of the fullerene molecule. For example, $C_{60}$ refers to a truncated icosahedron molecule including 32 faces, of which 12 are substantially pentagonal and 20 are substantially hexagonal. Other examples of fullerene molecules include $C_n$, where n is in the range of 50 to 250, such as $C_{70}$, $C_{72}$, $C_{74}$, $C_{76}$, $C_{78}$, $C_{80}$, $C_{82}$, and $C_{84}$. The term "fullerene derivative" refers to a fullerene that has been modified in any manner, including charged, hetero, or substituted forms thereof.

Additionally, concentrations, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Polar Elastomers

Some embodiments of this disclosure are directed to polar elastomers that can be incorporated in a wide variety of electronic and optoelectronic devices to provide improved performance characteristics to those devices. In some embodiments, the improved performance characteristics are attained through an electric double-layer charging effect in the polar elastomers under an applied electric field. The electric double-layer charging effect can boost a capacitance and an output (e.g., a current output or other output) of devices incorporating the polar elastomers. Advantageously, the polar elastomers can exhibit the electric double-layer charging effect even with a low ionic concentration, and can provide compatibility with standard manufacturing processes and high stability under ambient and high moisture conditions. Furthermore, a metal work function can be altered through contact with the polar elastomers.

In general, polar elastomers according to some embodiments of this disclosure can include a variety of different types of backbone structures and can include one or more types of monomeric units. In particular, a polar elastomer can have a backbone structure that is linear or non-linear. Examples of non-linear backbone structures include branched backbone structures, such as those that are star branched, comb branched, or brush branched, and network backbone structures. A polar elastomer can be a homopolymer that includes one type of monomeric unit or a copolymer that includes two or more different types of monomeric units. Different types of monomeric units of a copolymer can be arranged in accordance with a statistical distribution, in a random manner, in an alternating manner, in a periodic manner, in long sequences or blocks, in a radial manner, or in some other manner. Examples of copolymers include statistical copolymers, random copolymers, alternating copolymers, periodic copolymers, block copolymers, radial copolymers, and graft copolymers. In some embodiments, a polar elastomer can be capable of cross-linking, entanglement, or hydrogen bonding in order to increase its toughness or its resistance to degradation under ambient or manufacturing conditions. In some embodiments, a polar elastomer can have a number average molecular weight (or a weight average molecular weight) that is at least about 5,000, at least about 6,000, at least about 7,000, at least about 8,000, at least about 9,000, at least about 10,000, at least about 20,000, at least about 30,000, at least about 40,000, or at least about 50,000, an up to about 100,000, up to about 500,000, or more.

A polar elastomer of some embodiments includes at least one type of monomeric unit including polar groups. Advantageously, such polar groups provide electric dipoles that can promote dissociation and solvation of a salt to form ions, which can migrate in an electric double-layer charging process under an applied electric field. In some embodiments, suitable polar groups include those having an electric dipole moment of at least about 0.5 Debye, at least about 0.8 Debye, at least about 1 Debye, at least about 1.5 Debye, at least about 2 Debye, at least about 2.5 Debye, at least about 3 Debye, at least about 3.5 Debye, at least about 4 Debye, at least about 4.5 Debye, at least about 5 Debye, at least about 5.5 Debye, at least about 6 Debye, at least about 6.5 Debye, at least about 7 Debye, at least about 7.5 Debye, at least about 8 Debye, at least about 8.5 Debye, at least about 9 Debye, or at least about 9.5 Debye, and up to about 10 Debye, up to about 12 Debye, or more. In some embodiments, suitable polar groups include 2 or more atoms, such as 3 or more atoms, 4 or more atoms, 5 or more atoms, and so forth, although a polar group can also include a single atom. In some embodiments, suitable polar groups include 2 or more atoms, such as 3 or more atoms, 4 or more atoms, 5 or more atoms, and so forth, and where at least one of the atoms is a carbon atom. Examples of suitable polar groups include substituted alkyl groups (e.g., substituted with 1, 2, 3, or more halogen groups or other polar groups listed below, such as alkyl groups including from 1 to 10, 1 to 5, or 1 to 3 carbon atoms and substituted with 1, 2, 3, or more fluoro groups or other polar groups), substituted alkenyl groups (e.g., substituted with 1, 2, 3, or more halogen groups or other polar groups listed below, such as alkenyl groups including from 2 to 10, 2 to 5, or 2 to 3 carbon atoms and substituted with 1, 2, 3, or more fluoro groups or other polar groups), substituted alkynyl groups (e.g., substituted with 1, 2, 3, or more halogen groups or other polar groups listed below, such as alkynyl groups including from 2 to 10, 2 to 5, or 2 to 3 carbon atoms and substituted with 1, 2, 3, or more fluoro groups or other polar groups), substituted aryl groups (e.g., substituted with 1, 2, 3, or more halogen groups or other polar groups listed below, such as aryl groups including from 5 to 14 carbon atoms and substituted with 1, 2, 3, or more fluoro groups or other polar groups), hydroxyl groups, thio groups, cyano groups, nitro groups, amino groups, N-substituted amino groups, ammonium groups, N-substituted ammonium groups, amide groups, N-substituted amide groups, carboxy groups, alkylcarbonyloxy groups, alkenylcarbonyloxy groups, alkynylcarbonyloxy groups, arylcarbonyloxy groups, alkylcarbonylamino groups, N-substituted alkylcarbonylamino groups, alkenylcarbonylamino groups, N-substituted alkenylcarbonylamino groups, alkynylcarbonylamino groups, N-substituted alkynylcarbonylamino groups, arylcarbonylamino groups, N-substituted arylcarbonylamino groups, urea groups, epoxy groups, oxazolidone groups, and charged, substituted, or hetero forms thereof. Specific examples of suitable polar groups include —CF$_3$, fluoro-phenyl, difluoro-phenyl, trifluorophenyl, tetrafluoro-phenyl, pentafluoro-phenyl, and fluoro-thioenyl.

In some embodiments, polar groups of a polar elastomer can be bonded as side chains to a backbone structure, thereby providing greater freedom of rotation or other motion of the polar groups and facilitating a re-orientation of a local coordination geometry for effective dissolution and solvation of a salt. In such embodiments, the polar elastomer can be referred to as including polar group-containing side chains, and the polar groups can be directly bonded to the backbone structure, or can be bonded to the backbone structure via a linker atom or group, such as an alkylene group, an alkenylene group, an alkynylene group, or a hetero atom.

In addition, freedom of rotation or other motion of polar groups of a polar elastomer as well as other segmental motion of the polar elastomer are afforded or enhanced by an elastic, a rubbery, or an amorphous nature of the polymer, in which polymer chains and associated polar groups have the ability to rearrange in the presence of an applied electric field or other stress or stimulus, thereby promoting migration of solvated ions in an electric double-layer charging process. In some embodiments, a polar elastomer is an amorphous polymer, or includes amorphous regions, and has a low glass transition temperature ($T_g$) to allow rearrangement of polymer chains and associated polar groups at or above the glass transition temperature. In some embodiments, $T_g$ of a polar elastomer when measured in a bulk form can be no greater than about 25° C., no greater than about 20° C., no greater than about 10° C., no greater than about 0° C., no greater than about −5° C., no greater than about −10° C., no greater than about −15° C., or no greater than about −20° C., and down to about −30° C., down to about −50° C., down to about −100° C., or less. For example, $T_g$ of a polar elastomer when measured in a bulk form can be in the range of about −100° C. to about 25° C., about −100° C. to about −50° C., about −50° C. to about 25° C., from about −50° C. to about 0° C., or from about 0° C. to about 25° C. $T_g$ of a polar elastomer when measured in the form of a thin film can be higher relative to its bulk form value, although the above stated ranges generally are also applicable to polar elastomers that are implemented as thin films. More generally, $T_g$ of a polar elastomer can be selected to be no greater than, or below, a lower threshold of an operating temperature range of a device in which the polar elastomer is incorporated. Depending on the particular application, it is also contemplated that $T_g$ of a polar elastomer that is above about 25° C. can be suitable. $T_g$ of a polar elastomer can be adjusted, such as lowered to about 25° C. or less, by the addition of one or more plasticizers.

Figure 1B:
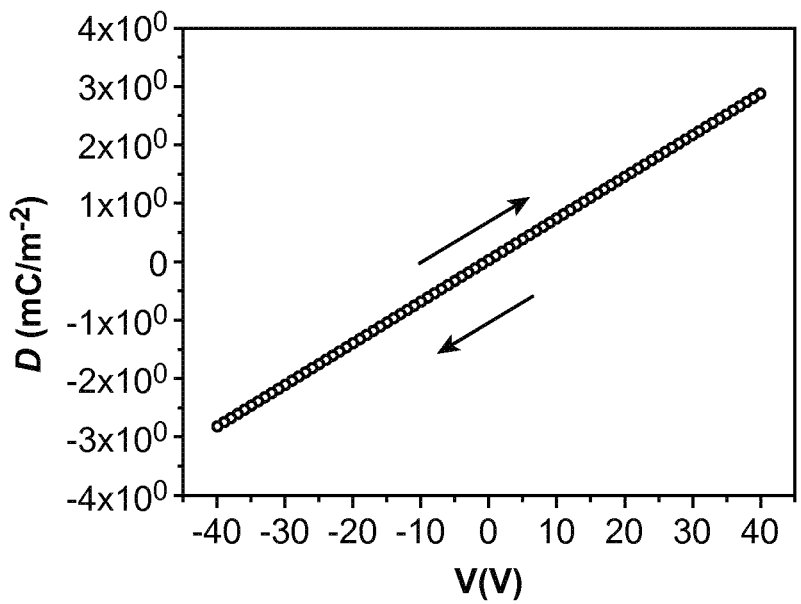
FIG. 1B: An example polarization-voltage curve of a polar elastomer of some embodiments of this disclosure, measured by a similar test setup.

At or above $T_g$ of a polar elastomer and in the substantial absence of an applied electric field, the polar elastomer is in a rubbery state, and freedom of rotation or other movement of polar groups of the polar elastomer can result in substantially randomly oriented electric dipoles. This random orientation, in turn, can yield an electric polarization of the polar elastomer, expressed as an average electric dipole moment per unit volume, that is substantially zero. This lack of a spontaneous, non-zero electric polarization in the case of a polar elastomer of some embodiments distinguishes the polar elastomer from certain ferroelectric materials, such as ferroelectric polymers. In some embodiments, polar elastomers can be distinguished from ferroelectric materials by using polarization-voltage curves. For example, FIG. 1A shows a typical polarization-voltage curve of a ferroelectric polymer, measured by applying a time-varying voltage across a layer of the ferroelectric polymer through a pair of electrodes sandwiching the layer of the ferroelectric polymer. The ferroelectric polymer has a significant polarization-voltage hysteresis along with a spontaneous, non-zero electric polarization when the applied voltage is zero. On the other hand, FIG. 1B shows an example polarization-voltage curve of a polar elastomer of some embodiments of this disclosure, measured by a similar test setup. The electric polarization is substantially linear to an applied voltage with little or no hysteresis and with little or no electric polarization when the applied voltage is substantially zero. In some embodiments, the electric polarization of the polar elastomer is no greater than about 1 mC/m$^2$ when the applied voltage is substantially 0 V, such as no greater than about 0.9 mC/m$^2$, no greater than about 0.8 mC/m$^2$, no greater than about 0.7 mC/m$^2$, no greater than about 0.6 mC/m$^2$, no greater than about 0.5 mC/m$^2$, no greater than about 0.4 mC/m$^2$, no greater than about 0.3 mC/m$^2$, no greater than about 0.2 mC/m$^2$, no greater than about 0.1 mC/m$^2$, no greater than about 0.05 mC/m$^2$, or no greater than about 0.01 mC/m$^2$, and down to about 0.001 mC/m$^2$ or less, down to about 0.0001 mC/m$^2$ or less, or down to zero.

A polar elastomer can be partially or fully elastic in some embodiments, and can be partially or fully viscoelastic in some embodiments. A polar elastomer also can be relatively inelastic or can exhibit little or no viscoelasticity in some embodiments. For example, a polar elastomer can have some tendency to return to its original size and shape after being deformed, such as to within ±99% of its original size, within ±90% of its original size, within ±80% of its original size, within ±70% of its original size, within ±60% of its original size, within ±50% of its original size, within ±40% of its original size, within ±30% of its original size, within ±20% of its original size, within ±10% of its original size, within ±5% of its original size, or within ±1% of its original size. A polar elastomer can be manifested by other characteristics. For example, a polar elastomer can be relatively soft with a Young's modulus of up to about 1 GPa, up to about 0.9 GPa, up to about 0.8 GPa, up to about 0.7 GPa, up to about 0.6 GPa, up to about 0.5 GPa, up to about 0.4 GPa, up to about 0.3 GPa, up to about 0.2 GPa, up to about 0.1 GPa, or up to about 0.05 GPa, and down to about 0.01 GPa, down to about 0.005 GPa, or less. As another example, a polar elastomer can have a relatively high percentage elongation-at-break of at least about 20%, at least about 30%, at least about 40%, at least about 50%, at least about 60%, at least about 70%, at least about 80%, at least about 90%, at least about 100%, at least about 150%, or at least about 200%, and up to about 300%, up to about 400%, up to about 500%, or more.

By exhibiting an electric double-layer charging effect, a polar elastomer of some embodiments can have a high capacitance even with a low ionic concentration. In some embodiments, a capacitance of a polar elastomer when measured at a frequency of about 10 Hz or less, such as about 1 Hz, about 0.1 Hz, or less, or under quasi-static conditions, can be at least about 0.005 μF/cm$^2$, at least about 0.007 μF/cm$^2$, at least about 0.01 μF/cm$^2$, at least about 0.03 μF/cm$^2$, at least about 0.05 μF/cm$^2$, at least about 0.07 μF/cm$^2$, at least about 0.1 μF/cm$^2$, at least about 0.3 μF/cm$^2$, or at least about 0.5 μF/cm$^2$, and up to about 0.7 μF/cm$^2$, up to about 1 μF/cm$^2$, up to about 1.3 μF/cm$^2$, or more.

In some embodiments, a polar elastomer can include, or can be combined or mixed with, ions, which can be in the form of anions and cations, and which can migrate in an electric double-layer charging process under an applied electric field. The ions can derive from a salt that is included during curing or other manufacturing process to form the polar elastomer. An ionic concentration, expressed as a weight percentage of the ions included in the polar elastomer (or as a weight percentage of the salt from which the ions are derived) relative to a total weight of the polar elastomer along with the ions, can be no greater than about 5% by weight, no greater than about 4% by weight, no greater than about 3% by weight, no greater than about 2% by weight, no greater than about 1% by weight, no greater than about 0.9% by weight, no greater than about 0.8% by weight, no greater than about 0.7% by weight, no greater than about 0.6% by weight, or no greater than about 0.5% by weight, and down to about 0.3% by weight, down to about 0.2% by weight, down to about 0.1% by weight, or less. Such a low ionic concentration allows a polar elastomer to be highly stable and resistant against high moisture conditions, and mitigates against undesired diffusion of ions into adjacent device layers that can lead to redox reactions and material degradation. Examples of suitable salts (from which ions can derive) include organic salts, such as quaternary phosphonium salts like $(CH_3)_2(C_2H_5)_2P^+Cl^-$, $(C_2H_5)_3C_{18}H_{37}P^+SO_4H^-$, $(CycloC_6H_{11})_2(C_6H_{13})_2P^+NO_3^-$, $(C_4H_9)_3CH_2=CH—CH_2P^+Cl^-$, $(C_6H_5)_3C_6H_5CH_2P^+CH_3CO_2^-$, $(C_6H_5)_3CH_3OC_2H_5P^+Cl^-$, $(C_8H_{17})_3(CH_3)_2NCH_2CH_2P^+Cl^-$, $(C_8H_{17})_3HOC_2H_5P^+Cl^-$, $Cl^{-+}(C_2H_5)_3CH_2CH_2CH_2CH_2(C_2H_5)_3P^+Cl^-$, and tetrabutyl phosphonium captate, and quaternary ammonium salts like $(CH_3)_3N^+OH^-$, $(C_4H_9)_3N^+Cl^-$, $HO^-(C_4H_9)_3N^+CH_2CH_2N^+(C_4H_9)_3OH^-$, $(C_4H_9)_3CH_2=CHCH_2N^{+-}OPO(OC_2H_5)_2$, and $CF_3CF_2OCF_2CF_2OCF_2CH_2N^+(C_4H_9)_3BF_6^-$. Examples of ions include organic cations and counter anions, such as phosphonium cations and counter anions in the above example quaternary phosphonium salts, as well as ammonium cations and counter anions in the above example quaternary ammonium salts.

An ionic concentration of a polar elastomer can be manifested by other characteristics. For example, a polar elastomer of some embodiments can include a low ionic concentration such that an ionic conductivity of the polar elastomer is less than about $1\times10^{-5}$ S/cm, such as no greater than about $1\times10^{-6}$ S/cm, no greater than about $5\times10^{-7}$ S/cm, no greater than about $1\times10^{-7}$ S/cm, no greater than about $5\times10^{-8}$ S/cm, no greater than about $1\times10^{-8}$ S/cm, no greater than about $5\times10^{-9}$ S/cm, no greater than about $1\times10^{-9}$ S/cm, no greater than about $5\times10^{-10}$ S/cm, or no greater than about $1\times10^{-10}$ S/cm, and down to about $8\times10^{-11}$ S/cm, down to about $5\times10^{-11}$ S/cm, down to about $1\times10^{-11}$ S/cm, down to about $1\times10^{-12}$ S/cm, or less.

A high stability of a polar elastomer under moisture conditions also can be afforded by its hydrophobic nature. The hydrophobic nature of a polar elastomer can be characterized in terms of its wettability, which can be specified based on a contact angle between a surface of the polar elastomer and a drop of liquid water disposed on the surface. The contact angle can be the angle at which the liquid-vapor interface intersects the solid-liquid interface. The hydrophobic nature of a polar elastomer of some embodiments can yield contact angles greater than or equal to about 90°, such as at least about 95°, at least about 100°, at least about 105°, at least about 110°, at least about 115°, or at least about 120°, and up to about 140°, up to about 150°, or more.

As noted above, a polar elastomer of some embodiments includes at least one type of monomeric unit including polar groups. For example, a polar elastomer can be a homopolymer that includes one type of monomeric unit including one or more polar groups that are the same or different. As another example, a polar elastomer can be a copolymer that includes two or more different types of monomeric units, and at least one type of monomeric unit includes one or more polar groups that are the same or different. In the case of a copolymer of some embodiments, each type of monomeric unit can include one or more polar groups that are the same or different, and different types of monomeric units can include polar groups that are the same or different. In the case of a copolymer of other embodiments, at least one type of monomeric unit can include one or more polar groups that are the same or different, and at least another type of monomeric unit can lack any polar group or can include one or more groups having a low polarity, such as those having an electric dipole moment of less than about 0.5 Debye. In such embodiments of the copolymer, a molar content or fraction (e.g., a combined molar content) of monomeric units including polar groups relative to all monomeric units is at least or greater than about 0.2 (or about 20%), at least or greater than about 0.25 (or about 25%), at least or greater than about 0.3 (or about 30%), at least or greater than about 0.35 (or about 35%), at least or greater than about 0.4 (or about 40%), at least or greater than about 0.45 (or about 45%), at least or greater than about 0.5 (or about 50%), at least or greater than about 0.55 (or about 55%), at least or greater than about 0.6 (or about 60%), at least or greater than about 0.65 (or about 65%), at least or greater than about 0.7 (or about 70%), or at least or greater than about 0.75 (or about 75%), and up to about 0.8 (or about 80%), up to about 0.9 (or about 90%), or more.

According to some embodiments, a polar elastomer is a homopolymer given by the formula:

$$-[M]_n-$$

where M is a polar monomeric unit including one or more polar groups, and n is greater than one and represents a number of monomeric units included in the polar elastomer and, hence, a degree of polymerization of the polar elastomer. M can be selected from, for example, alkylene groups, alkenylene groups, and alkynylene groups including from 2 to 10 carbon atoms, such as 2 to 8, 2 to 6, 2 to 4, 2 to 3, or 2 carbon atoms, which are substituted with at least one polar group, such as 1, 2, 3, or 4 polar groups that are the same or different, and which are optionally further substituted with at least one halogen group, such as 1, 2, 3, or 4 halogen groups that are the same or different. A specific example of M is hexafluoropropylene (HFP), among other alkylene groups substituted with at least one polar group, such as halogenated alkyl groups, cyano groups, nitro groups, and other polar groups. In some embodiments, n is at least about 10, at least about 20, at least about 50, at least about 100, at least about 500, or at least 1,000, and up to about 5,000, up to about 10,000, up to about 50,000, up to about 100,000, or more. In some embodiments, a polar elastomer given by the above formula can be cross-linked, or can be combined or mixed with one or more additional materials, such as selected from salts, ions, polymers, inorganic materials, organic materials, and nanostructures.

According to some embodiments, a polar elastomer is a copolymer given by either of the formulas:

$$-([M]_x[M']_y)_n-$$

$$-([M]_x[M']_y)-$$

where M is a first polar monomeric unit including one or more polar groups, M' is a different, second polar monomeric unit including one or more polar groups, $0<x<1$, $0<y<1$, $x+y=1$, and n is greater than one and represents a number of monomeric units included in the polar elastomer and, hence, a degree of polymerization of the polar elastomer. M and M' can be selected from, for example, alkylene groups, alkenylene groups, and alkynylene groups including from 2 to 10 carbon atoms, such as 2 to 8, 2 to 6, 2 to 4, 2 to 3, or 2 carbon atoms, which are substituted with at least one polar group, such as 1, 2, 3, or 4 polar groups that are the same or different, and which are optionally further substituted with at least one halogen group, such as 1, 2, 3, or 4 halogen groups that are the same or different. A specific example of M or M' is HFP, among other alkylene groups substituted with at least one polar group, such as halogenated alkyl groups, cyano groups, nitro groups, and other polar groups. In some embodiments, n is at least about 10, at least about 20, at least about 50, at least about 100, at least about 500, or at least 1,000, and up to about 5,000, up to about 10,000, up to about 50,000, up to about 100,000, or more. The copolymer given by the above formulas can be a statistical copolymer, a random copolymer, an alternating copolymer, a periodic copolymer, a block copolymer, a radial copolymer, or a graft copolymer. In some embodiments, a polar elastomer given by the above formulas can be cross-linked, or can be combined or mixed with one or more additional materials, such as selected from salts, ions, polymers, inorganic materials, organic materials, and nanostructures.

According to some embodiments, a polar elastomer is a copolymer given by either of the formulas:

$$-([M]_x[M']_y)_n-$$

$$-([M]_x[M']_y)-$$

where M is a first polar monomeric unit including one or more polar groups, M' is a different, second monomeric unit lacking any such polar groups, $0<x<1$, $0<y<1$, $x+y=1$, and n is greater than one and represents a number of monomeric units included in the polar elastomer and, hence, a degree of polymerization of the polar elastomer. M can be selected from, for example, alkylene groups, alkenylene groups, and alkynylene groups including from 2 to 10 carbon atoms, such as 2 to 8, 2 to 6, 2 to 4, 2 to 3, or 2 carbon atoms, which are substituted with at least one polar group, such as 1, 2, 3, or 4 polar groups that are the same or different, and which are optionally further substituted with at least one halogen group, such as 1, 2, 3, or 4 halogen groups that are the same or different. M' can be selected from, for example, alkylene groups, alkenylene groups, and alkynylene groups including from 2 to 10 carbon atoms, such as 2 to 8, 2 to 6, 2 to 4, 2 to 3, or 2 carbon atoms, which are optionally substituted with at least one halogen group, such as 1, 2, 3, or 4 halogen groups that are the same or different. A specific example of M is HFP, among other alkylene groups substituted with at least one polar group, such as halogenated alkyl groups, cyano groups, nitro groups, and other polar groups, and specific examples of M' include 1,1-difluoroethylene (vinylidene fluoride, VDF), 1-fluoroethylene (vinylfluoride, VF), 1-chloro-2-fluoroethylene (CFE), tetrafluoroethylene (TFE), chlorotrifluoroethylene (CTFE), and trifluoroethylene (TrFE). In some embodiments, $0.2 \leq x<1$, $0.25 \leq x<1$, $0.3 \leq x<1$, $0.35 \leq x<1$, $0.4 \leq x<1$, $0.45 \leq x<1$, $0.5 \leq x<1$, $0.55 \leq x<1$, $0.6 \leq x<1$, $0.65 \leq x<1$, $0.7 \leq x<1$, or $0.75 \leq x<1$. In some embodiments, n is at least about 10, at least about 20, at least about 50, at least about 100, at least about 500, or at least 1,000, and up to about 5,000, up to about 10,000, up to about 50,000, up to about 100,000, or more. The copolymer given by the above formulas can be a statistical copolymer, a random copolymer, an alternating copolymer, a periodic copolymer, a block copolymer, a radial copolymer, or a graft copolymer. In some embodiments, a polar elastomer given by the above formulas can be cross-linked, or can be combined or mixed with one or more additional materials, such as selected from salts, ions, polymers, inorganic materials, organic materials, and nanostructures.

According to some embodiments, a polar elastomer is a copolymer given by either of the formulas:

$$-([M]_x[M']_y[M'']_z)_n-$$

$$-([M]_x[M']_y[M'']_z)-$$

where M is a first polar monomeric unit including one or more polar groups, M' is a different, second polar monomeric unit including one or more polar groups, M" is a different, third polar monomeric unit including one or more polar groups, $0<x<1$, $0<y<1$, $0<z<1$, $x+y+z=1$, and n is greater than one and represents a number of monomeric units included in the polar elastomer and, hence, a degree of polymerization of the polar elastomer. M, M', and M" can be selected from, for example, alkylene groups, alkenylene groups, and alkynylene groups including from 2 to 10 carbon atoms, such as 2 to 8, 2 to 6, 2 to 4, 2 to 3, or 2 carbon atoms, which are substituted with at least one polar group, such as 1, 2, 3, or 4 polar groups that are the same or different, and which are optionally further substituted with at least one halogen group, such as 1, 2, 3, or 4 halogen groups that are the same or different. A specific example of M, M', or M" is HFP, among other alkylene groups substituted with at least one polar group, such as halogenated alkyl groups, cyano groups, nitro groups, and other polar groups. In some embodiments, n is at least about 10, at least about 20, at least about 50, at least about 100, at least about 500, or at least 1,000, and up to about 5,000, up to about 10,000, up to about 50,000, up to about 100,000, or more. The copolymer given by the above formulas can be a statistical copolymer, a random copolymer, an alternating copolymer, a periodic copolymer, a block copolymer, a radial copolymer, or a graft copolymer. In some embodiments, a polar elastomer given by the above formulas can be cross-linked, or can be combined or mixed with one or more additional materials, such as selected from salts, ions, polymers, inorganic materials, organic materials, and nanostructures.

According to some embodiments, a polar elastomer is a copolymer given by either of the formulas:

$$-([M]_x[M']_y[M'']_z)_n-$$

$$-([M]_x[M']_y[M'']_z)-$$

where M is a first polar monomeric unit including one or more polar groups, M' is a different, second monomeric unit lacking any such polar groups, M" is a different, third monomeric unit lacking any such polar groups, $0<x<1$, $0<y<1$, $0<z<1$, $x+y+z=1$, and n is greater than one and represents a number of monomeric units included in the polar elastomer and, hence, a degree of polymerization of the polar elastomer. M can be selected from, for example, alkylene groups, alkenylene groups, and alkynylene groups including from 2 to 10 carbon atoms, such as 2 to 8, 2 to 6, 2 to 4, 2 to 3, or 2 carbon atoms, which are substituted with at least one polar group, such as 1, 2, 3, or 4 polar groups that are the same or different, and which are optionally further substituted with at least one halogen group, such as 1, 2, 3, or 4 halogen groups that are the same or different. M' and M" can be selected from, for example, alkylene groups, alkenylene groups, and alkynylene groups including from 2 to 10 carbon atoms, such as 2 to 8, 2 to 6, 2 to 4, 2 to 3, or 2 carbon atoms, which are optionally substituted with at least one halogen group, such as 1, 2, 3, or 4 halogen groups that are the same or different. A specific example of M is HFP, among other alkylene groups substituted with at least one polar group, such as halogenated alkyl groups, cyano groups, nitro groups, and other polar groups, and specific examples of M' and M" include VDF, VF, CFE, TFE, CTFE, and TrFE. In some embodiments, $0.2 \leq x < 1$, $0.25 \leq x < 1$, $0.3 \leq x < 1$, $0.35 \leq x < 1$, $0.4 \leq x < 1$, $0.45 \leq x < 1$, $0.5 \leq x < 1$, $0.55 \leq x < 1$, $0.6 \leq x < 1$, $0.65 \leq x < 1$, $0.7 \leq x < 1$, or $0.75 \leq x < 1$. In some embodiments, n is at least about 10, at least about 20, at least about 50, at least about 100, at least about 500, or at least 1,000, and up to about 5,000, up to about 10,000, up to about 50,000, up to about 100,000, or more. The copolymer given by the above formulas can be a statistical copolymer, a random copolymer, an alternating copolymer, a periodic copolymer, a block copolymer, a radial copolymer, or a graft copolymer. In some embodiments, a polar elastomer given by the above formulas can be cross-linked, or can be combined or mixed with one or more additional materials, such as selected from salts, ions, polymers, inorganic materials, organic materials, and nanostructures.

According to some embodiments, a polar elastomer is a copolymer given by either of the formulas:

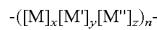

where M is a first polar monomeric unit including one or more polar groups, M' is a different, second polar monomeric unit including one or more polar groups, M" is a different, third monomeric unit lacking any such polar groups, $0 < x < 1$, $0 < y < 1$, $0 < z < 1$, $x+y+z=1$, and n is greater than one and represents a number of monomeric units included in the polar elastomer and, hence, a degree of polymerization of the polar elastomer. M and M' can be selected from, for example, alkylene groups, alkenylene groups, and alkynylene groups including from 2 to 10 carbon atoms, such as 2 to 8, 2 to 6, 2 to 4, 2 to 3, or 2 carbon atoms, which are substituted with at least one polar group, such as 1, 2, 3, or 4 polar groups that are the same or different, and which are optionally further substituted with at least one halogen group, such as 1, 2, 3, or 4 halogen groups that are the same or different. M" can be selected from, for example, alkylene groups, alkenylene groups, and alkynylene groups including from 2 to 10 carbon atoms, such as 2 to 8, 2 to 6, 2 to 4, 2 to 3, or 2 carbon atoms, which are optionally substituted with at least one halogen group, such as 1, 2, 3, or 4 halogen groups that are the same or different. A specific example of M or M' is HFP, among other alkylene groups substituted with at least one polar group, such as halogenated alkyl groups, cyano groups, nitro groups, and other polar groups, and specific examples of M" include VDF, VF, CFE, TFE, CTFE, and TrFE. In some embodiments, $0.2 \leq x+y < 1$, $0.25 \leq x+y < 1$, $0.3 \leq x+y < 1$, $0.35 \leq x+y < 1$, $0.4 \leq x+y < 1$, $0.45 \leq x+y < 1$, $0.5 \leq x+y < 1$, $0.55 \leq x+y < 1$, $0.6 \leq x+y < 1$, $0.65 \leq x+y < 1$, $0.7 \leq x+y < 1$, or $0.75 \leq x+y < 1$. In some embodiments, n is at least about 10, at least about 20, at least about 50, at least about 100, at least about 500, or at least 1,000, and up to about 5,000, up to about 10,000, up to about 50,000, up to about 100,000, or more. The copolymer given by the above formulas can be a statistical copolymer, a random copolymer, an alternating copolymer, a periodic copolymer, a block copolymer, a radial copolymer, or a graft copolymer. In some embodiments, a polar elastomer given by the above formulas can be cross-linked, or can be combined or mixed with one or more additional materials, such as selected from salts, ions, polymers, inorganic materials, organic materials, and nanostructures.

Other embodiments of a polar elastomer are encompassed by this disclosure, such as including backbone structures based on carbamate (or urethane) links, such as polyurethane backbone structures, backbone structures based on siloxane links, polyether backbone structures, polyester backbone structures, polyamide backbone structures, and other types of backbone structures based on carbon-carbon links, carbon-oxygen links, silicon-oxygen links, carbon-nitrogen links, and hetero atom-hetero atom links, and with polar groups bonded to the backbone structures as side chains or included within the backbone structures.

Applications of Polar Elastomers

Polar elastomers described herein can be incorporated in a wide variety of electronic and optoelectronic devices to provide improved performance. Examples of devices that can benefit from the polar elastomers include transistors, light-emitting diodes, solar cells, display devices, biomedical devices, sensors, wearable electronics, and stretchable devices, among others.

Figure 2A:
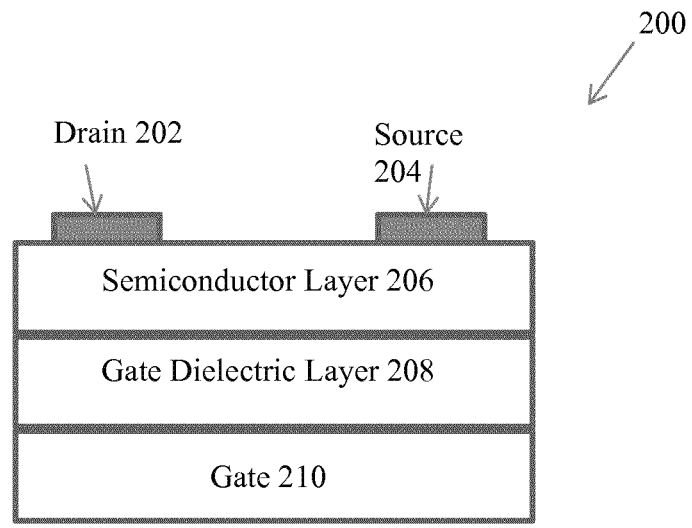
FIGS. 2(a), 2(b), 2(c), and 2(d): Schematics of various configurations of FETs, according to some embodiments of this disclosure.
Figure 2B:
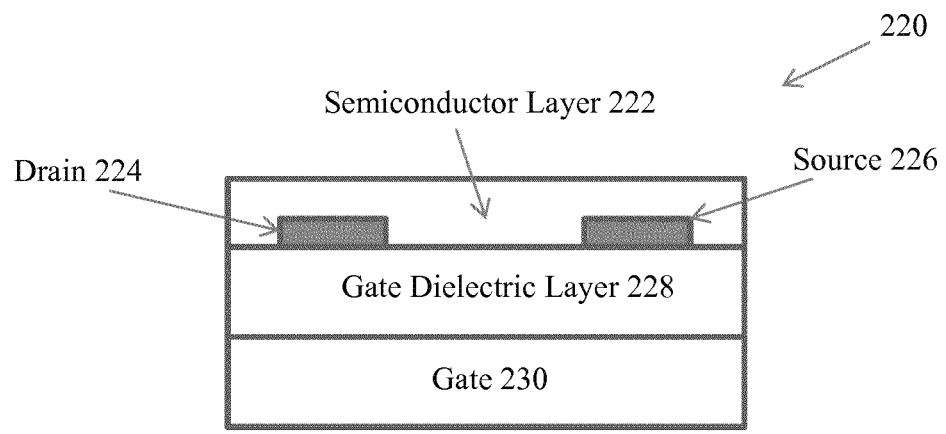
Figure 2C:
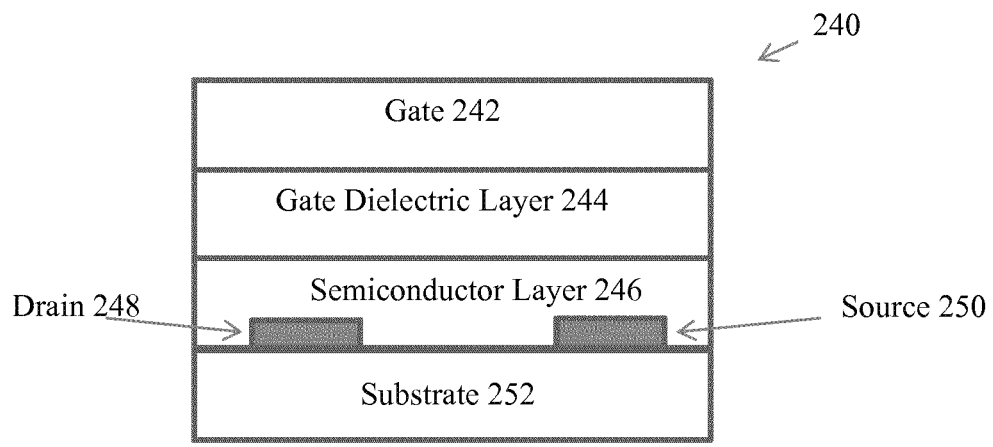
Figure 2D:
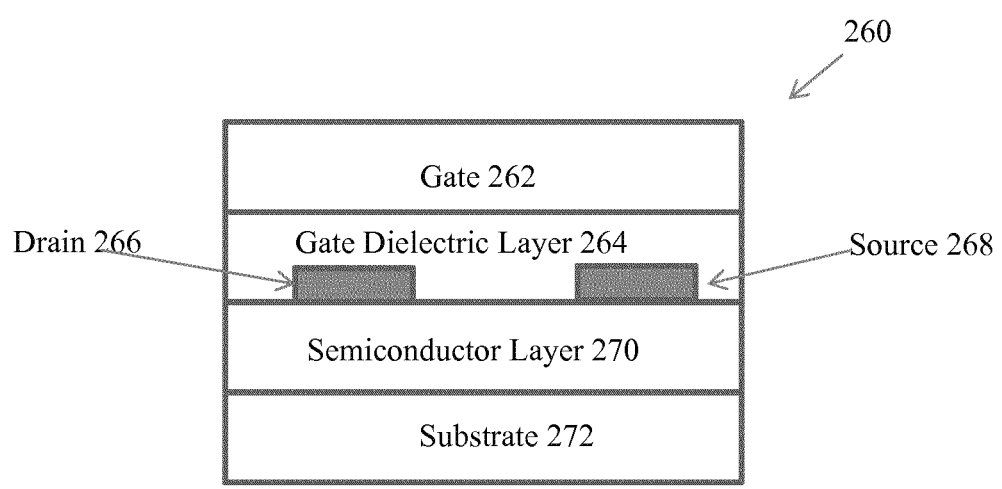

FIGS. 2(a)-(d) shows schematics of various configurations of field-effect transistors (FETs) 200, 220, 240, and 260, according to some embodiments of this disclosure. Specifically, FIG. 2(a) shows a top-contact, bottom-gate FET 200, FIG. 2(b) shows a bottom-contact, bottom-gate FET 220, FIG. 2(c) shows a bottom-contact, top-gate FET 240, and FIG. 2(d) shows a top-contact, top-gate FET 260.

Referring to FIG. 2(a), the top-contact, bottom-gate FET 200 includes a gate electrode 210, a gate dielectric layer 208 that is applied, formed, or otherwise disposed over the gate electrode 210, a semiconductor layer 206 that is applied, formed, or otherwise disposed over the gate dielectric layer 208, and drain and source electrodes 202 and 204 that are applied, formed, or otherwise disposed over the semiconductor layer 206.

In the illustrated embodiment, the gate dielectric layer 208 includes, or is formed of, a polar elastomer, and the gate dielectric layer 208 is in direct physical contact with, or is substantially immediately next to, the semiconductor layer 206 to provide improved FET performance through an electric double-layer capacitance effect. The gate dielectric layer 208 can be applied or formed over the gate electrode 210 by spin-coating or another suitable coating or deposition technique. Improved FET performance can be attained with the gate dielectric layer 208 being relatively thick, so as to reduce leakage current, mitigate against material migration across the gate dielectric layer 208 that otherwise can lead to degradation, and render compatibility with low-cost, high-throughput manufacturing processes. A thickness of the gate dielectric layer 208 can be at least about 200 nm, at least about 300 nm, at least about 400 nm, at least about 500 nm, at least about 600 nm, at least about 700 nm, at least about 800 nm, at least about 900 nm, at least about 1 μm, at least about 1.1 μm, at least about 1.2 μm, at least about 1.3 μm, or at least about 1.4 μm, and up to about 1.6 μm or more, up to about 1.8 μm or more, up to about 2 μm or more, up to about 2.2 μm or more, up to about 3 μm or more, up to about 4 μm or more, or up to about 5 μm or more. A surface roughness of the gate dielectric layer, such as an average or a root mean square roughness of a top surface, can be up to about 1.5 nm, up to about 1.4 nm, up to about 1.3 nm, up to about 1.2 nm, up to about 1.1 nm, up to about 1 nm, up to about 0.9 nm, up to about 0.8 nm, up to about 0.7 nm, up to about 0.6 nm, up to about 0.5 nm, up to about 0.4 nm, or up to about 0.35 nm, and down to about 0.3 nm or less, down to about 0.25 nm or less, or down to about 0.2 nm or less. The gate dielectric layer 208 can be multi-layered or can include one or more additional layers of other materials, while keeping the polar elastomer in direct physical contact with, or substantially immediately next to, the semiconductor layer 206. The gate dielectric layer 208 can be a patterned structure of lines, pyramids, or a membrane structure with holes.

The semiconductor layer 206 can include, or can be formed of, an organic semiconductor, an inorganic semiconductor, or a combination of the foregoing. Examples of suitable organic semiconductors include 1) semiconducting small molecules, including aromatic hydrocarbons such as pentacene, anthracene, rubrene, and other polycyclic aromatic hydrocarbons; 2) semiconducting oligomers and polymers, such as poly(3-hexyl thiophene), poly[2,5-bis(3-tetradecylthiophen-2-yl)thieno[3,2-b]thiophene], poly(tetrathiophene-dithiophenyl-diketopyrrolopyrrole), poly(tetrathienoacene-diketopyrrolopyrrole), poly(acetylene), poly(pyrrole), and poly(aniline); 3) fullerene and fullerene derivatives, such as [6,6]-phenyl-C61-butyric acid methyl ester; 4) graphene; 5) carbon nanotube; and 6) combinations of two or more of the foregoing. In the case where the semiconductor layer 206 includes an organic semiconductor, FIG. 2(a) corresponds to a configuration of an organic FET (OFET) or an organic thin-film transistor (OTFT). Examples of suitable inorganic semiconductors include Group 14 elements, such as silicon and germanium, Group 14-14 binary alloys, Group 12-16 binary alloys, Group 13-15 binary alloys, and other binary, ternary, quaternary, or higher order alloys of Group 11 elements, Group 12 elements, Group 13 elements, Group 14 elements, Group 15 elements, Group 16 elements, and Group 17 elements. Particular examples of suitable inorganic semiconductors include zinc oxide (ZnO), indium gallium zinc oxide (IGZO), silicon, and metal dichalcogenides such as $MoS_2$, and $MoSe_2$. Depending upon the particular application, the semiconductor layer 206 can include nanostructures including, or formed of, one or more of the foregoing materials, such as a semiconducting polymer, graphene, carbon nanotubes, $MoS_2$, silicon nanowires or other nanowires, or nanoparticles. The semiconductor layer 206 can be applied or formed over the gate dielectric layer 208 by lamination, spin-coating, or another suitable coating or deposition technique.

Each of the drain, source, and gate electrodes 202, 204, and 210 can include, or can be formed of, a metal, a metal alloy, a n-doped or p-doped semiconductor, or a combination of two or more of the foregoing. The gate electrode 210 can be formed by, for example, doping of a semiconductor substrate, and the drain and source electrodes 202 and 204 can be applied or formed over the semiconductor layer 206 by evaporation or another suitable coating or deposition technique.

During operation of the FET 200 of FIG. 2(a), a drain voltage can be applied to the drain electrode 202 or between the drain and source electrodes 202 and 204 ($V_D$ or $V_{DS}$), and a gate voltage can be applied to the gate electrode 210 ($V_G$), thereby inducing a current to flow between the drain and source electrodes 202 and 204 through the semiconductor layer 206 ($I_{DS}$).

Referring next to FIG. 2(b), the bottom-contact, bottom-gate FET 220 includes a gate electrode 230, a gate dielectric layer 228 that is applied, formed, or otherwise disposed over the gate electrode 230, drain and source electrodes 224 and 226 that are applied, formed, or otherwise disposed over the gate dielectric layer 228, and a semiconductor layer 222 that is applied, formed, or otherwise disposed over the gate dielectric layer 228 and the drain and source electrodes 224 and 226. In the illustrated embodiment, the gate dielectric layer 228 includes, or is formed of, a polar elastomer, and the gate dielectric layer 228 is in direct physical contact with, or is substantially immediately next to, the semiconductor layer 222 to provide improved FET performance through an electric double-layer capacitance effect. The gate dielectric layer 228 can be multi-layered or can include one or more additional layers of other materials, while keeping the polar elastomer in direct physical contact with, or substantially immediately next to, the semiconductor layer 222. The gate dielectric layer 228 can be a patterned structure of lines, pyramids, or a membrane structure with holes. Various aspects of the FET 220 of FIG. 2(b) can be similarly implemented as explained above for FIG. 2(a), and those aspects are not repeated.

Referring next to FIG. 2(c), the bottom-contact, top-gate FET 240 includes a substrate 252, drain and source electrodes 248 and 250 that are applied, formed, or otherwise disposed over the substrate 252, a semiconductor layer 246 that is applied, formed, or otherwise disposed over the substrate 252 and the drain and source electrodes 248 and 250, a gate dielectric layer 244 that is applied, formed, or otherwise disposed over the semiconductor layer 246, and a gate electrode 242 that is applied, formed, or otherwise disposed over the gate dielectric layer 244. In the illustrated embodiment, the gate dielectric layer 244 includes, or is formed of, a polar elastomer, and the gate dielectric layer 244 is in direct physical contact with, or is substantially immediately next to, the semiconductor layer 246 to provide improved FET performance through an electric double-layer capacitance effect. The gate dielectric layer 244 can be multi-layered or can include one or more additional layers of other materials, while keeping the polar elastomer in direct physical contact with, or substantially immediately next to, the semiconductor layer 246. The gate dielectric layer 244 can be a patterned structure of lines, pyramids, or a membrane structure with holes. Various aspects of the FET 240 of FIG. 2(c) can be similarly implemented as explained above for FIG. 2(a), and those aspects are not repeated.

Referring next to FIG. 2(d), the top-contact, top-gate FET 260 includes a substrate 272, a semiconductor layer 270 that is applied, formed, or otherwise disposed over the substrate 272, drain and source electrodes 266 and 268 that are applied, formed, or otherwise disposed over the semiconductor layer 270, a gate dielectric layer 264 that is applied, formed, or otherwise disposed over the semiconductor layer 270 and the drain and source electrodes 266 and 268, and a gate electrode 262 that is applied, formed, or otherwise disposed over the gate dielectric layer 264. In the illustrated embodiment, the gate dielectric layer 264 includes, or is formed of, a polar elastomer, and the gate dielectric layer 264 is in direct physical contact with, or is substantially immediately next to, the semiconductor layer 270 to provide improved FET performance through an electric double-layer capacitance effect. The gate dielectric layer 264 can be multi-layered or can include one or more additional layers of other materials, while keeping the polar elastomer in direct physical contact with, or substantially immediately next to, the semiconductor layer 270. The gate dielectric layer 264 can be a patterned structure of lines, pyramids, or a membrane structure with holes. Various aspects of the FET 260 of FIG. 2(d) can be similarly implemented as explained above for FIG. 2(a), and those aspects are not repeated.

Advantageously, FETs incorporating a polar elastomer as a gate dielectric, such as the FETs 200, 220, 240, and 260 shown in FIGS. 2(a)-(d), can exhibit a number of improved performance characteristics. For example, FETs can have a high on-current (expressed in terms of a magnitude or an absolute value of $I_{DS}$) of at least about $1\times10^{-6}$ A, at least about $3\times10^{-6}$ A, at least about $5\times10^{-6}$ A, at least about $8\times10^{-6}$ A, at least about $1\times10^{-5}$ A, at least about $3\times10^{-5}$ A, at least about $5\times10^{-5}$ A, at least about $8\times10^{-5}$ A, or at least about $1\times10^{-4}$ A, and up to about $3\times10^{-4}$ A or more, up to about $5\times10^{-4}$ A or more, up to about $8\times10^{-4}$ A or more, or up to about $1\times10^{-3}$ A or more, when operated at, for example, a low magnitude or a low absolute value of $V_G$ of about 5 V (or another value such as 2 V, 3 V, or 4 V) and a magnitude or an absolute value of $V_{DS}$ of about 4 V (or another value such as 5 V, 3 V, or 2 V), with a W/L ratio of, for example, about 20, where W is a channel width, and L is a channel length. The current output can change with the W/L ratio in some embodiments.

As another example, FETs can have a high transconductance per channel width of at least about $1\times10^{-4}$ S m$^{-1}$, at least about $3\times10^{-4}$ S m$^{-1}$, at least about $5\times10^{-4}$ S m$^{-1}$, at least about $8\times10^{-4}$ S m$^{-1}$, at least about $1\times10^{-3}$ S m$^{-1}$, at least about $3\times10^{-3}$ S m$^{-1}$, at least about $5\times10^{-3}$ S m$^{-1}$, at least about $8\times10^{-3}$ S m$^{-1}$, at least about $1\times10^{-2}$ S m$^{-1}$, or at least about $2\times10^{-2}$ S m$^{-1}$, and up to about $3\times10^{-2}$ S m' or more, up to about $5\times10^{-2}$ S m$^{-1}$ or more, up to about $8\times10^{-2}$ S m$^{-1}$ or more, or up to about $1\times10^{-1}$ S m$^{-1}$ or more, when operated at, for example, a low magnitude or a low absolute value of $V_G$ of about 3 V (or another value such as 2 V, 4 V, or 5 V).

As another example, FETs can have a high on/off current ratios in a linear or saturation regime of at least about 6, at least about 25, at least about 50, at least about $1\times10^2$, at least about $2\times10^2$, at least about $3\times10^2$, at least about $5\times10^2$, at least about $1\times10^3$, at least about $2\times10^3$, at least about $3\times10^3$, at least about $4\times10^3$, at least about $5\times10^3$, at least about $6\times10^3$, at least about $7\times10^3$, at least about $8\times10^3$, at least about $9\times10^3$, or at least about $1\times10^4$, and up to about $2\times10^4$ or more, up to about $5\times10^4$ or more, or up to about $1\times10^5$ or more.

As a further example, FETs incorporating a polar elastomer as a gate dielectric can have a fast switching speed, such as expressed in terms of a response time to reach an on-state (specified as 80% of a maximum current) and a response time to reach an off-state (specified as 20% of the maximum current), where the response times are up to about 500 µs, up to about 400 µs, up to about 300 µs, up to about 200 µs, up to about 100 µs, up to about 90 µs, up to about 80 µs, up to about 70 µs, or up to about 60 µs, and down to about 50 µs or less, down to about 45 µs or less, down to about 10 µs or less, down to about 1 µs or less, or down to about 0.1 µs or less. The fast switching speed also can be expressed in terms of an operation frequency range of the FETs, where the FETs can operate at a frequency of at least about 1 Hz, about 10 Hz, about 100 Hz, about 1 kHz, or about 10 kHz while maintaining an on/off current ratio of at least about 25, at least about 50, or at least about $1\times10^2$.

Figure 3A:
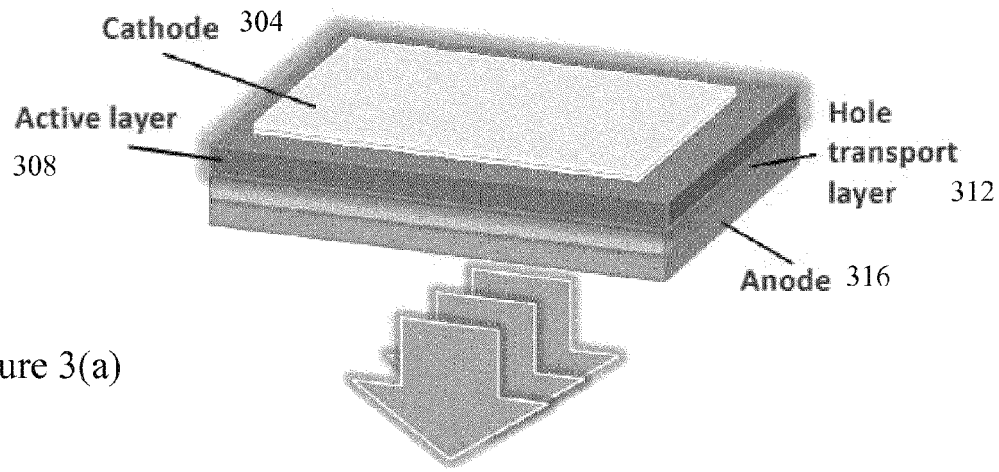
FIGS. 3(a) and 3(b): Schematics of configurations of additional devices, according to some embodiments of this disclosure.
Figure 3B:
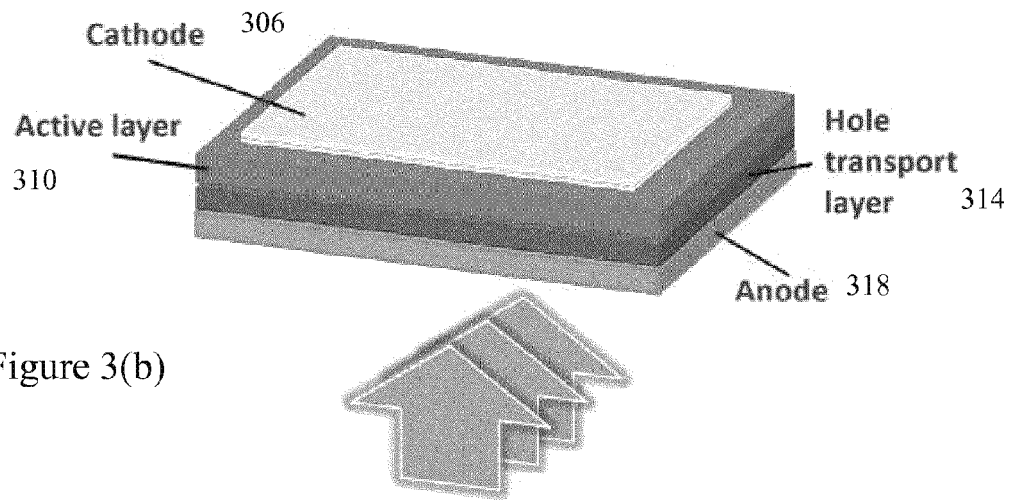

Other devices that can benefit from incorporation of polar elastomers include light-emitting diodes, solar cells, light-emitting transistors, memory devices, phototransistors, transistor sensors, and electrochemical transistors, among others. FIGS. 3(a) and 3(b) show schematics of a light-emitting diode 300 and a solar cell 302, according to some embodiments of this disclosure. Referring to FIGS. 3(a) and 3(b), each of the devices 300 and 302 include an anode 316 or 318, a hole transport layer 312 or 314 that is applied, formed, or otherwise disposed over the anode 316 or 318, an active layer 308 or 310 that is applied, formed, or otherwise disposed over the hole transport layer 312 or 314, and a cathode 304 or 306 that is applied, formed, or otherwise disposed over the active layer 308 or 310. The hole transport layer 312 or 314 can include, or can be formed of, a semiconductor, and the active layer 308 or 310 can include, or can be formed of, one or more semiconductors that form a junction, such as a p-n junction. Suitable semiconductors include those explained with reference to FIGS. 2(a)-2(d). Each of the devices 300 and 302 of FIGS. 3(a) and 3(b) incorporates a polar elastomer, such as within, or as part of, at least one of the illustrated layers so as to be in direct physical contact with, or substantially immediately next to, a semiconductor included in the devices 300 and 302. Alternatively, or in conjunction, the polar elastomer can be incorporated in the devices 300 and 302 as a separate layer (not shown) that is in direct physical contact with, or is substantially immediately next to, a semiconductor included in the devices 300 and 302. For example, the polar elastomer can be incorporated as a separate layer between the cathode 304 or 306 and the active layer 308 or 310, as a separate layer between the active layer 308 or 310 and the hole transport layer 312 or 314, as a separate layer between the hole transport layer 312 or 314 and the anode 316 or 318, or a combination of two or more of the foregoing. Various aspects of the devices 300 and 302 of FIGS. 3(a) and 3(b) can be similarly implemented as explained above for FIGS. 2(a)-2(d), and those aspects are not repeated.

EXAMPLE

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Example 1

Double-Layer Capacitance Effect in Dielectrics of Polar Elastomers and Applications Towards High-Performance, Low-Voltage, High-Transconductance Organic Transistors Both high gain and high transconductance at low operating voltages are desirable for practical applications of organic field-effect transistors (OFETs). This example describes the significance of a double-layer capacitance effect in dielectrics of polar elastomers, despite a very low ionic concentration and ionic conductivity. It is observed that this effect greatly enhances a transconductance of an OFET at low voltages. Specifically, when a polar elastomeric poly(vinylidene fluoride-co-hexafluoropropylene) (e-PVDF-HFP) was used as a dielectric material, a low ionic conductivity of about $10^{-11}$ S/cm was observed without doping. Furthermore, a transconductance per channel width was obtained which was about 30× higher than that measured for the same organic semiconductors fabricated on a semi-crystalline PVDF-HFP. Compared to other high-transconductance OFETs having double-layer capacitance effects, the dielectrics of this example have distinct advantages of compatibility with standard manufacturing processes and high stabilities in both air and water. Hence, a resulting device is able to demonstrate unprecedented stable operation in water with low bias stress effects.

Figure 8A:
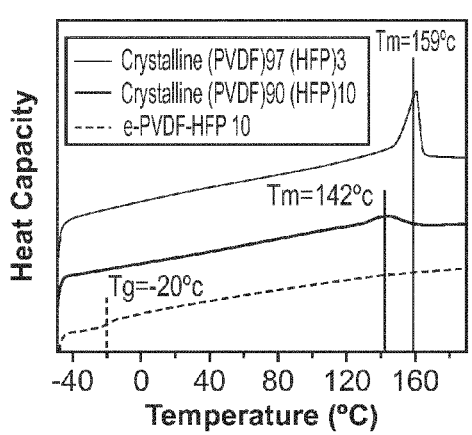
FIGS. 8A and 8B: Physical properties of e-PVDF-HFP.
Figure 8B:
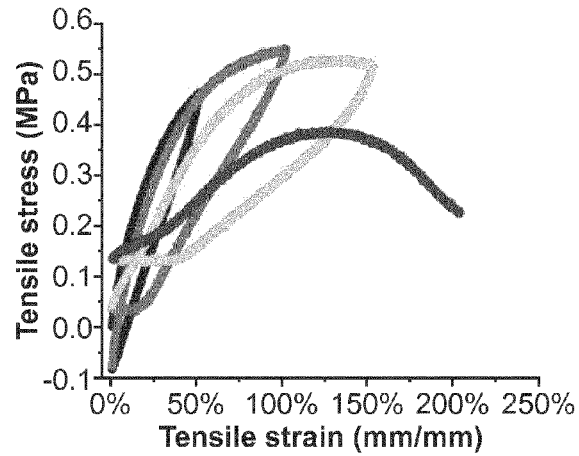
Figure 9A:
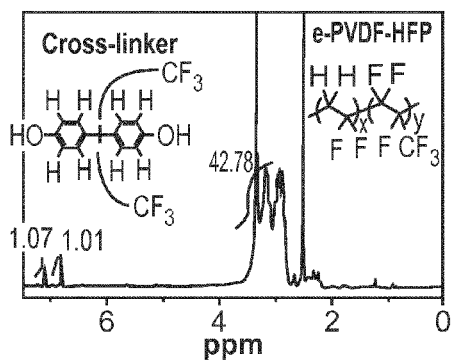
FIGS. 9A, 9B and 9C: Nuclear magnetic resonance (NMR) spectra of e-PVDF-HFP polymer.
Figure 9B:
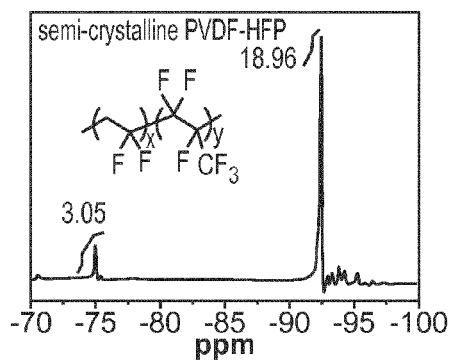
Figure 9C:
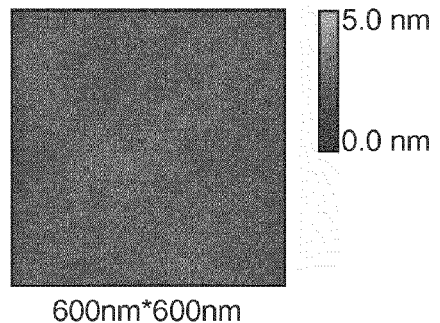

A polar fluorinated PVDF-HFP elastomer, despite a low ionic concentration, induces electric double-layer charging under an applied gate voltage. This polymer dielectric is solution-processable with a high static capacitance of about 0.3 µF/cm² (or more), even at a thickness of several micrometers. Devices made from this thick polymer dielectric are capable of operating at low voltages with a transconductance as high as about 0.02 S m$^{-1}$ (or more). This polymer dielectric is highly compatible with solution processing of various organic semiconductors. Remarkably, the resulting devices showed both high current output and low bias stress in both ambient and aqueous conditions. It was observed that PVDF-HFP polymers are semi-crystalline when a high molar fraction of VDF units are incorporated. However, a molar fraction of HFP units can be used to tune mechanical properties of PVDF-HFP (see FIGS. 8A and 8B). Here, e-PVDF-HFP, containing about 45 mol. % HFP (determined by NMR as shown in FIGS. 9A-9C), is an elastic material with a glass transition temperature ($T_g$) of about −20° C. (FIGS. 8A and 8B). Its dielectric constant is about 11 as measured at 1 kHz, a value consistent with a range of about 8 to about 13.

Thick polymer dielectric films (about 1.4 µm to about 5 µm) are used for OFETs of this example as such a thickness can significantly reduce leakage current and is more readily attainable with large-scale coating processes. The films displayed a smooth surface (surface roughness of about 0.3 nm), a low leakage current (about 10$^{-6}$ A cm$^{-2}$ at V=−1 V for a thickness of about 1.4 µm) and a high breakdown electric field exceeding about 0.3 MV/cm (FIGS. 11A-14B).

To evaluate device performance using this elastic high-k dielectric, poly(tetrathienoacene-diketopyrrolopyrrole) (PT-DPPTFT4), chemical structure shown in FIGS. 4A-4C, was initially selected as a semiconductor layer due to its high charge mobility (see also FIGS. 17A, 17B, 18A and 18B). The device exhibited a high on-current of about 10$^{-4}$ A at $V_G$ of about −5 V, despite a thick dielectric layer (about 1.4 µm) used. Additionally, a subthreshold slope of the device is about 120 mV decade$^{-1}$, which is comparable to the lowest values obtained for organic thin-film transistors (OTFTs). Furthermore, a threshold voltage ($V_{TH}$) is <about 1 V, which is highly desirable in low-voltage-driven applications. More importantly, the PTDPPTFT4 device exhibits a high transconductance per channel width of about 0.02 S m$^{-1}$ at a gate voltage of about −3 V. OTFTs operating at low voltages can be achieved by using poly(vinylidene fluoride-trifluoroethylene-chlorofluoroethylene) (P(VDF-TrFE-CFE)) as a dielectric layer with a high dielectric constant of up to about 60 at low frequencies. However, a thin layer of about 160 nm is included to achieve a high transconductance per channel width of about 4×10$^{-3}$ S m$^{-1}$ at about −3 V. The value achieved with the device of this example is comparable to the best reported OTFTs with ultra-thin self-assembled monolayer (SAM) dielectrics, although somewhat lower than a reported value with a gel electrolyte dielectric. However, since the e-PVDF-HFP dielectric polymer of this example contains no further added ions, it is highly compatible with standard device fabrication processes and results in devices which display stable operation in ambient conditions and even under water, as discussed in more detail below. It is also contemplated that ions can be further added to tune device performance while maintaining processing compatibility and device stability.

Even though a high transconductance at a low voltage is particularly desirable for practical applications, charge carrier mobility is typically used to characterize a charge transport ability of a semiconductor. The charge carrier mobility is calculated from standard metal-oxide-semiconductor field-effect transistor (MOSFET) models from saturation and linear regimes, and is dependent on a capacitance value used for the calculation. Most non-ionic dielectrics exhibit relatively constant capacitances regardless of a measurement frequency. The capacitance of e-PVDF-HFP was also found to remain almost unchanged from about 20 to about 100 kHz, but it increased rapidly as the frequency was decreased to below about 1 Hz (see FIG. 13). Therefore, the typical procedure for mobility calculation using a capacitance value measured at ≥20 Hz would result in an overestimation of mobility. This issue was further confirmed by measuring transistors with e-PVDF-HFP of various thicknesses. Even though capacitances measured at about 20 Hz scaled with dielectric thickness as expected for typical capacitors (FIGS. 11A-11C), a transistor output current did not show an expected scaling with dielectric thickness. This result indicates the origin of such high transconductance in the devices as likely distinctive from those formed using other PVDF-based dielectrics, which primarily utilize their high polarizibility. Additional measurements are made of the capacitance in the quasi-static limit. Indeed, a sharp rise in the capacitance value is observed at low frequencies approaching the quasi-static limit. Furthermore, the capacitance showed little change as a function of the thickness of the dielectric layer (FIG. 11A), indicating a double-layer charging effect was present in the system. The high capacitance also explains the high transconductance obtained at a low operating voltage.

Figure 5A:
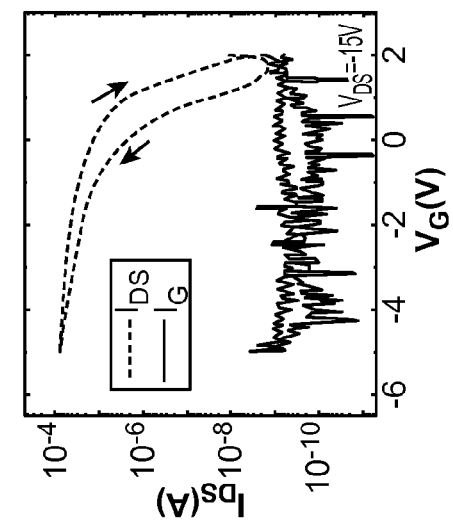
FIGS. 5A, 5B, 5C, 5D, 5E, and 5F: Device characteristics of PTDPPTFT4 transistors fabricated on e-PVDF-HFP and semi-crystalline poly(vinylidene fluoride-co-hexafluoropropylene) (c-PVDF-HFP).
Figure 5B:
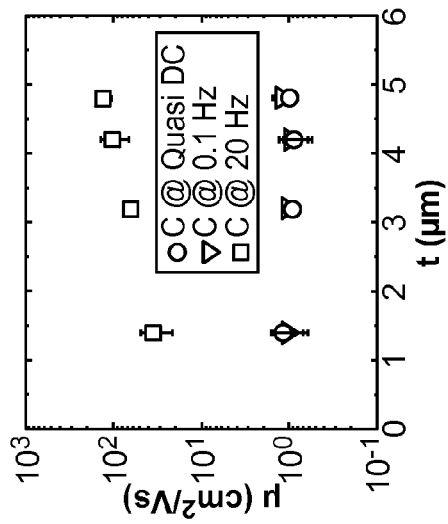
Figure 11A:
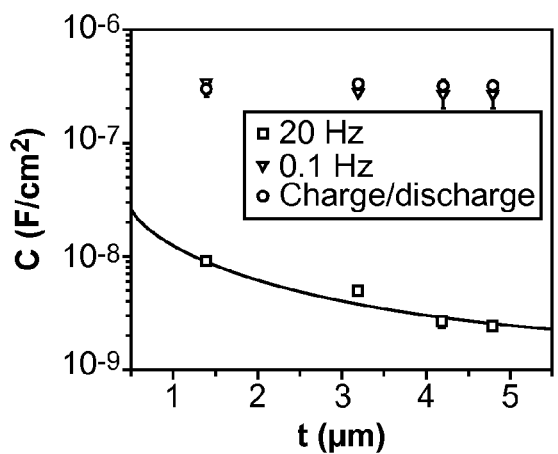
FIGS. 11A, 11B and 11C: The dependence of the capacitance as a function of a dielectric layer thickness for e-PVDF-HFP, c-PVDF-HFP and poly(dimethylsiloxane) (PDMS).
Figure 11B:
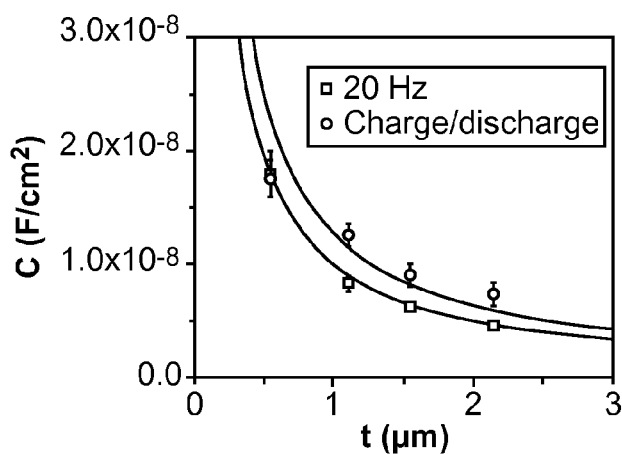
Figure 11C:
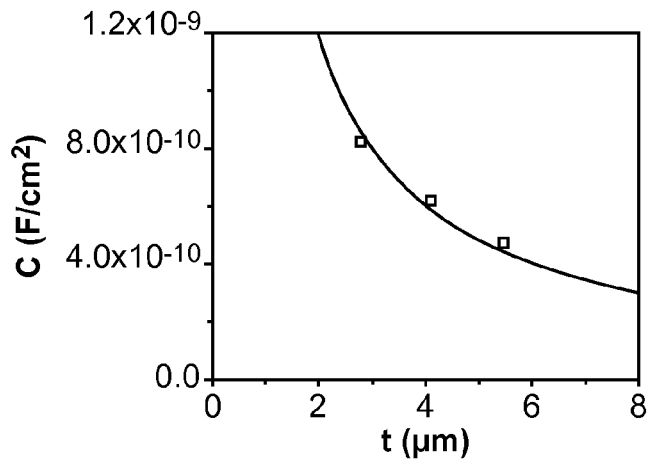
Figure 12A:
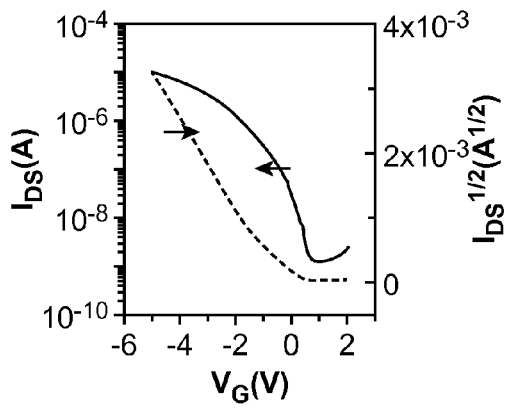
FIGS. 12A, 12B, 12C, 12D and 12E: Transfer characteristics of OTFTs formed from various organic semiconductors on e-PVDF-HFP (about 1.4 µm thickness). All devices include bottom-gate and top-contact gold (Au) drain and source electrodes with L=about 50 µm and W=about 1,000 µm. All devices were measured in a nitrogen atmosphere.
Figure 12B:
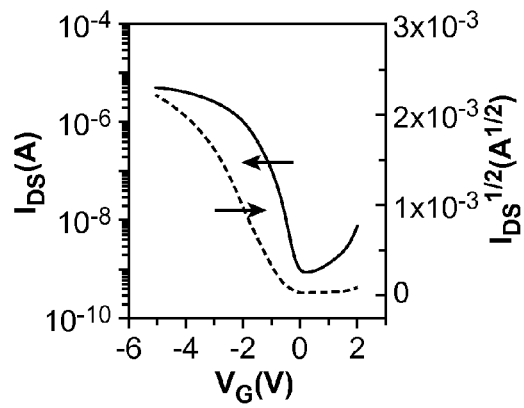
Figure 12C:
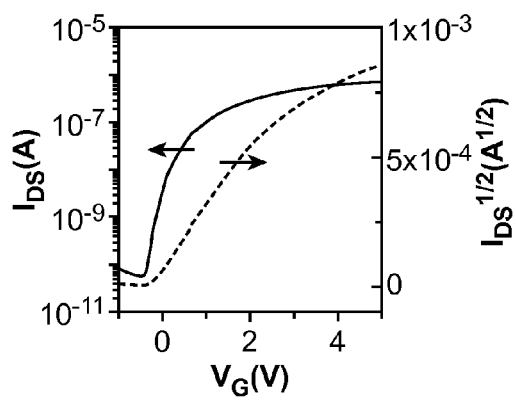
Figure 12D:
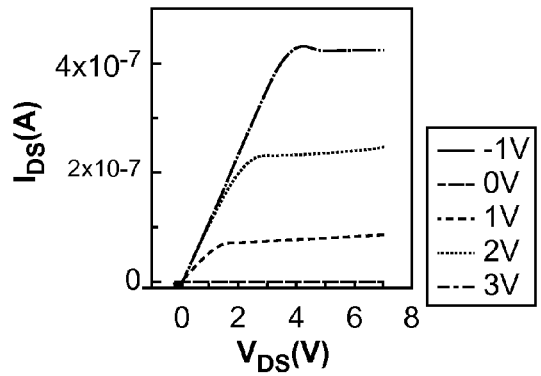
Figure 12E:
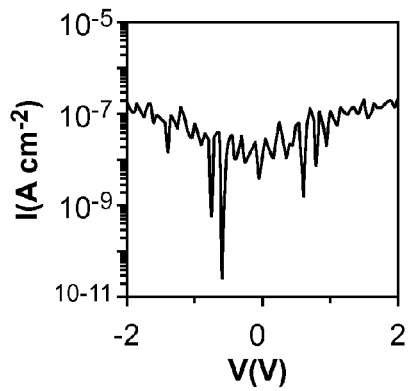
Figure 13:
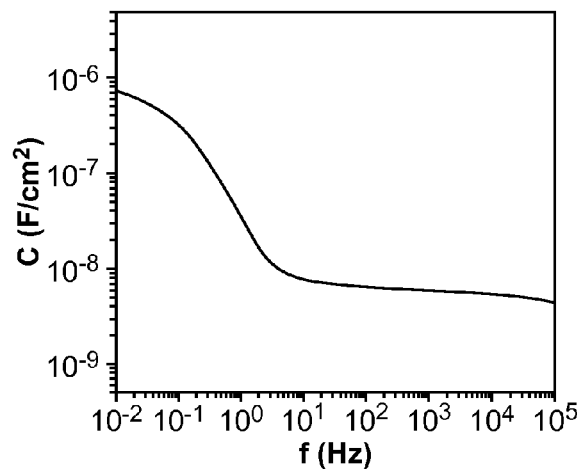
FIG. 13: The capacitance of about 1.4 µm thick e-PVDF-HFP at different frequencies. The capacitance was measured using Biologic VMP3 electrochemistry workstation. It is roughly a constant value in the frequency range from about 10 Hz to about 105 Hz, corresponding to a regular charging process of a capacitor. The sharp rise of the capacitance values below about 10 Hz is due to electric double-layer charging.
Figure 14A:
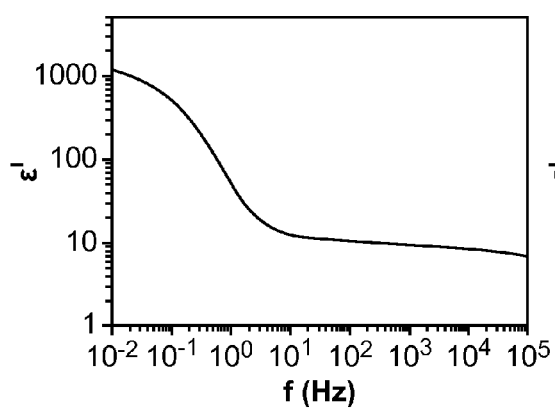
FIGS. 14A and 14B: Dielectric permittivity spectra over a range of frequencies from about $10^{-2}$ to about $10^5$ Hz. $\in'$ (in FIG. 14A) and $\in''$ (in FIG. 14B) denote the real and the imaginary parts of the permittivity, respectively. $\in''$ is inversely proportional to the frequency from about 1 to about 100 Hz, which allows an ionic conductivity to be extracted as about $8\times10^{-11}$ S/cm. The values were measured using Biologic VMP3 electrochemistry workstation.
Figure 14B:
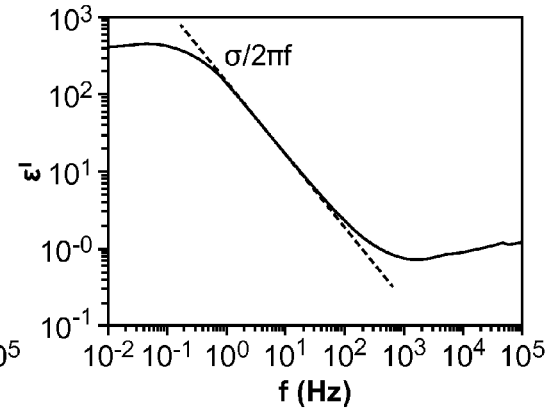
Figure 15C:
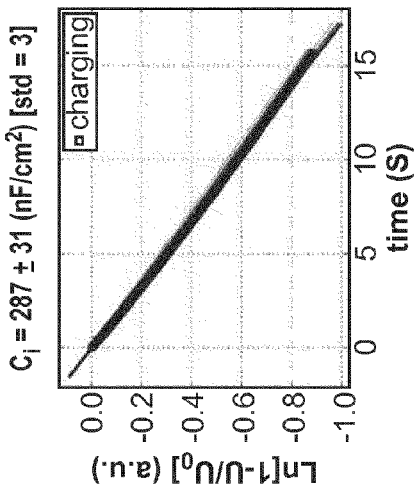
FIGS. 15A, 15B, 15C, 15D, 15E and 15F: Quasi-static capacitance measurement based on charging/discharging of a RC circuit.
Figure 15B:
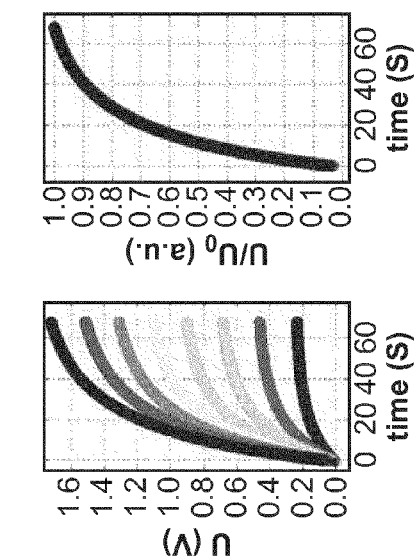
Figure 15A:
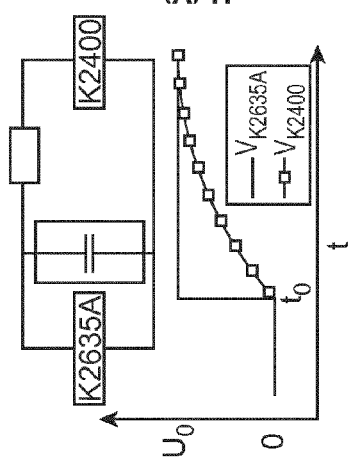
Figure 15F:
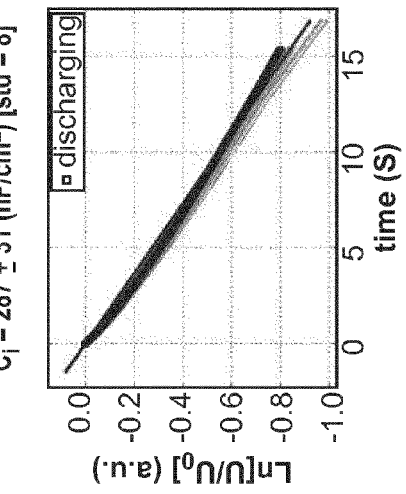
Figure 15E:
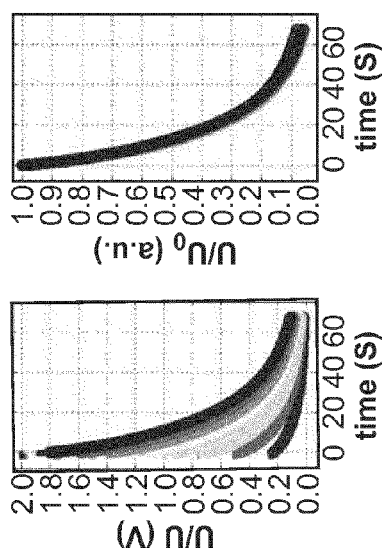
Figure 15D:
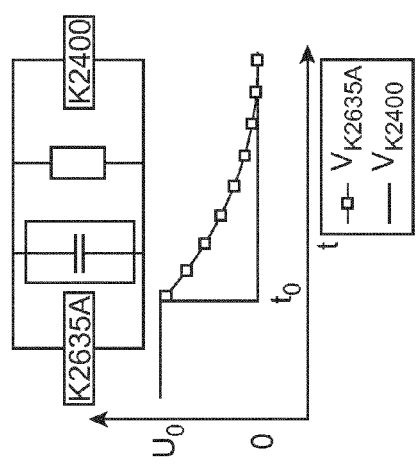
Figure 16C:
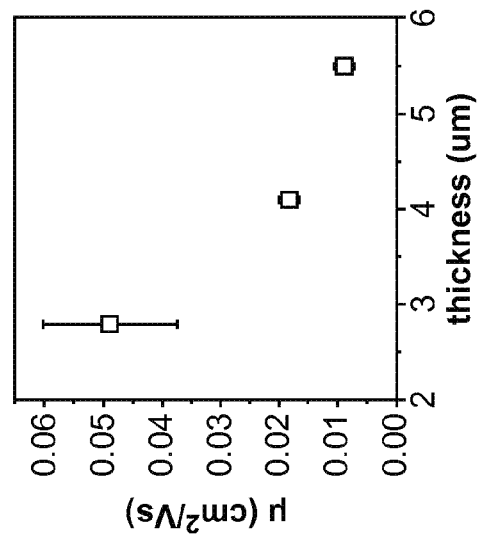
FIGS. 16A, 16B and 16C: Device characteristics of OTFTs fabricated on a PDMS dielectric layer with different thicknesses.
Figure 16B:
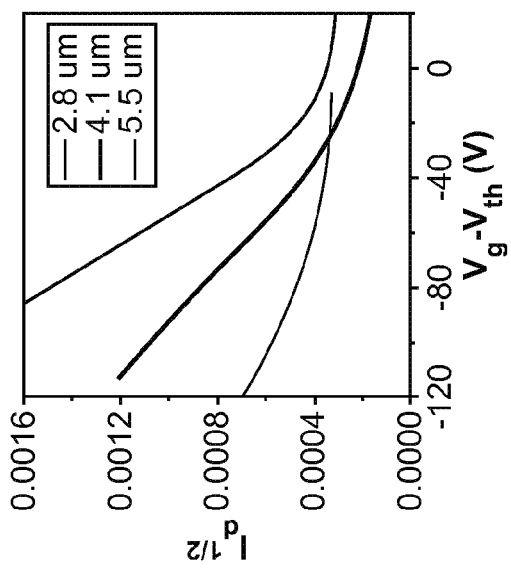
Figure 16A:
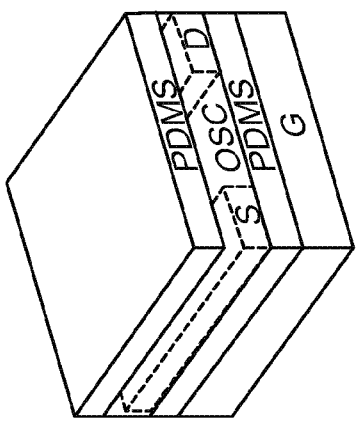
Figure 17A:
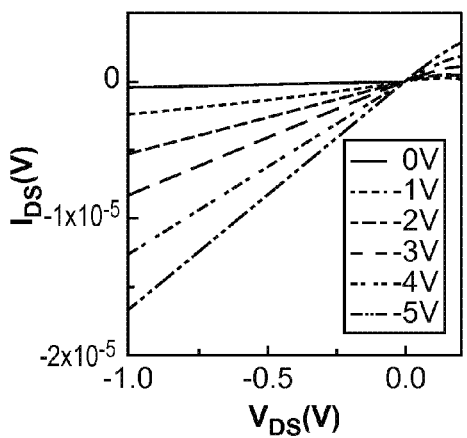
FIGS. 17A and 17B: Linear-regime current-voltage curves of PTDPPTFT4.
Figure 17B:
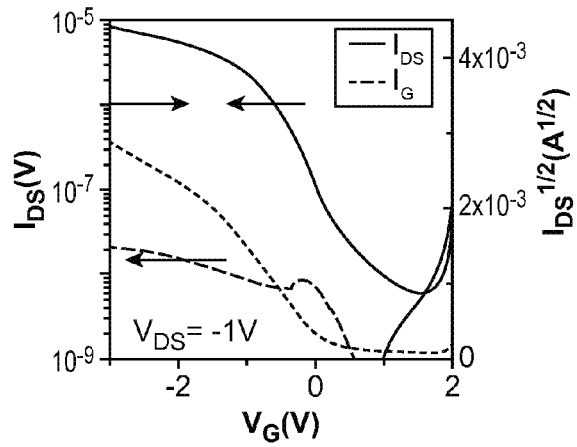
Figure 18A:
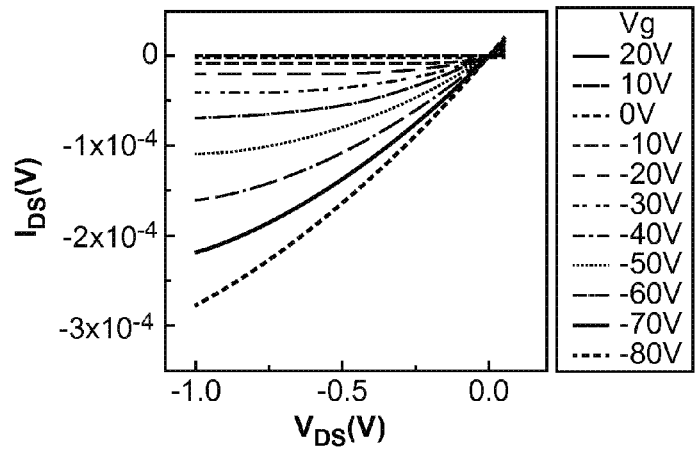
FIGS. 18A and 18B: Typical current-voltage curves of PTDPPTFT4 control devices formed on a semi-crystalline PVDF-HFP dielectric layer.
Figure 18B:
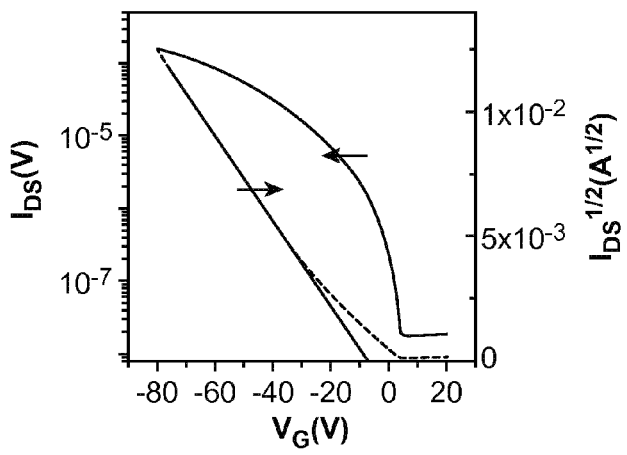

To further confirm the capacitance value in the quasi-static limit, measurements are made of the time constant of a RC circuit based on an e-PVDF-HFP capacitor and an external resistor (FIGS. 15A-15F). Interestingly, no voltage dependence of the capacitance was observed. This result confirms the high capacitance at a low frequency of about 0.1 Hz, which allows explicit determination of the capacitance (FIGS. 11A-11C) and the corresponding mobility (FIG. 5B) from OTFT measurements. The double-layer charging effect and the high capacitance at low frequency for e-PVDF-HFP are surprising, considering that no ions were further added. In comparison, a gel electrolyte dielectric can be composed primarily of ionic liquid species immobilized inside a polymer matrix, and can have a high ionic conductivity on the order of 10$^{-2}$-10$^{-5}$ S/cm. The measured ionic conductivity for the e-PVDF-HFP of this example is many orders of magnitude lower, in the range of about 8×10$^{-11}$ S/cm (see FIGS. 14A-14B). In contrast, when a semi-crystalline PVDF-HFP (about 90% of VDF by molar fraction, termed as c-PVDF-HFP) is used as a dielectric layer, an output current decreased as expected for conventional dielectrics with increasing c-PVDF-HFP thickness from about 0.55 µm to about 2.15 µm (FIG. 11B). The quasi-static capacitance through charging/discharging of a RC circuit also yielded similar capacitance values as those measured at higher frequencies (>20 Hz).

Figure 10A:
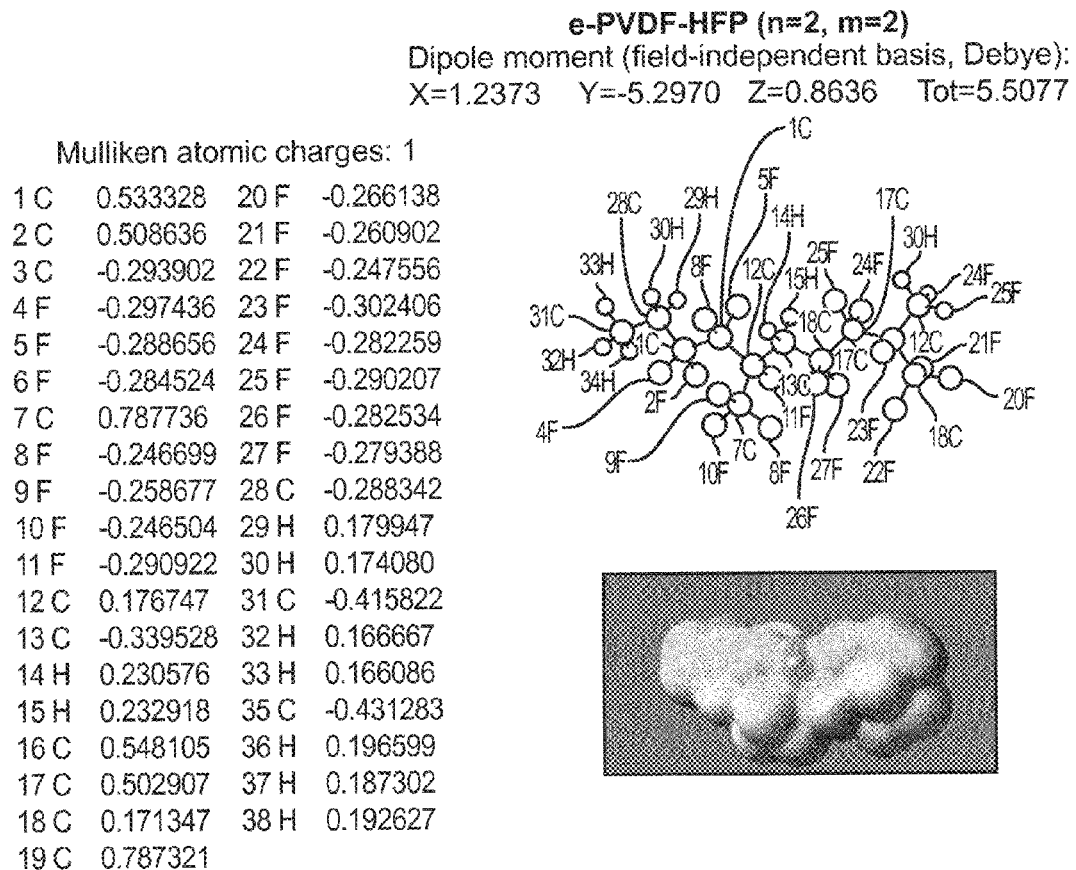
FIGS. 10A and 10B: Calculation of dipole moment in VDF-HFP units.
Figure 10B:
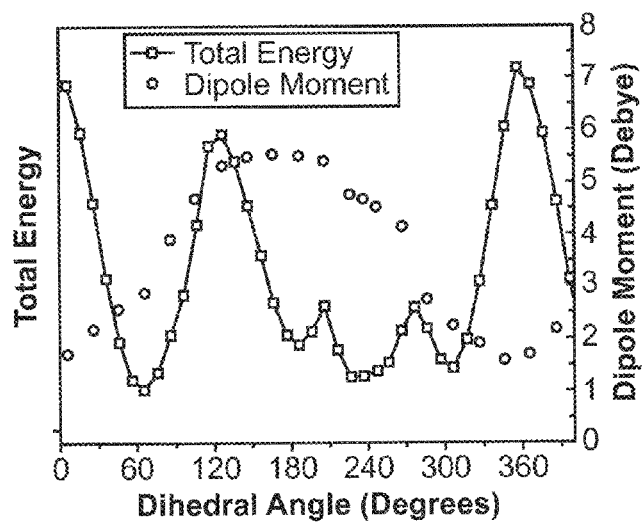

The above results indicate that the unusual double-layer charging effect in the e-PVDF-HFP of this example is related to its low $T_g$ (about −20° C.). Elastic polymers are desirable matrixes for ion conductors due to a high segmental motion that facilitates reorientation of local coordination geometry for effective solvation of salts. Furthermore, a high concentration of polar groups in e-PVDF-HFP is desirable to solvate a salt to form a polymer-salt complex, where the salt may derive from a cross-linking reagent or impurities (typically phosphonium compounds and so forth) incorporated during curing or other processing (see FIGS. 10A-10B). In the case of c-PVDF-HFP, no clear evidence of ion contribution to a charging process is identified due to the suppressed segmental motion in the high melting temperature ($T_m$ of about 142° C.) crystalline dielectric. Poly(dimethylsiloxane) (PDMS) is an example of an elastic dielectric. However, it does not exhibit signatures of electric double-layer charging due to its low polarity (FIG. 11C and FIGS. 16A-16C). Therefore, e-PVDF-HFP is an unusual dielectric that exhibits the double-layer charging effect of ionic dielectrics without further addition of ions, while also maintaining processing characteristics and stability of non-ionic dielectrics.

Figure 5D:
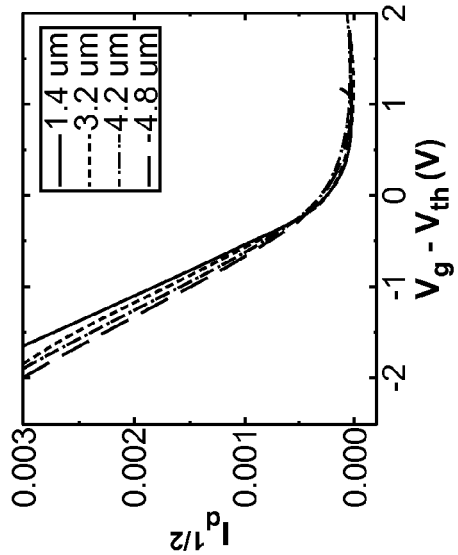
Figure 5C:
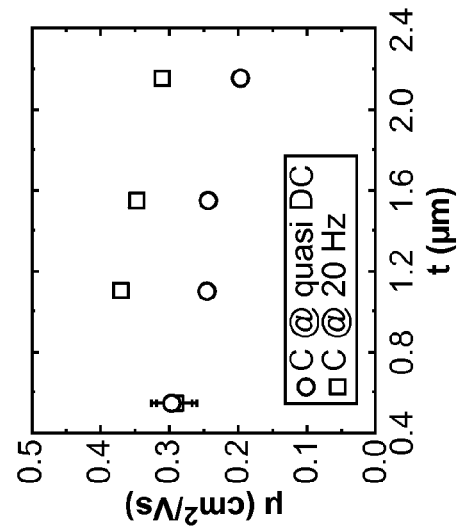
Figure 5E:
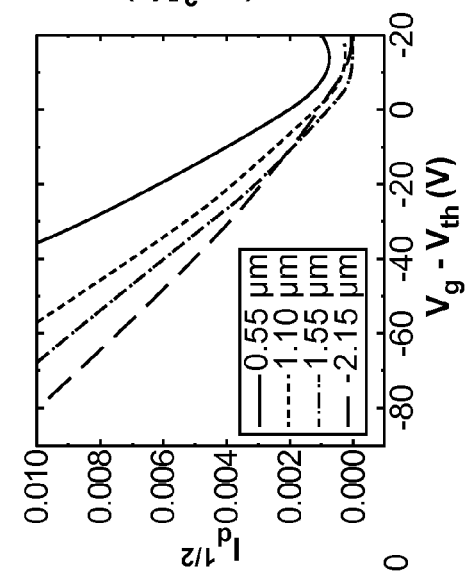
Figure 5F:
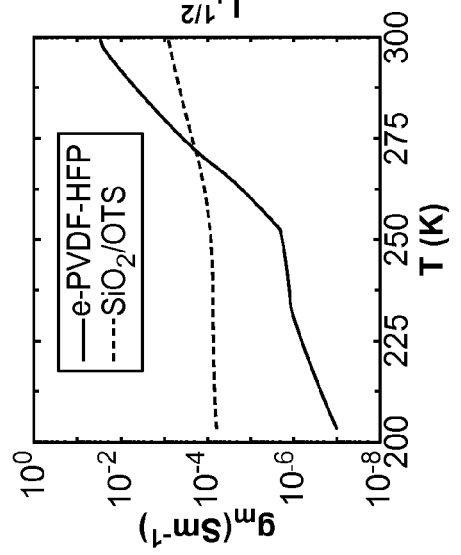
Figure 20A:
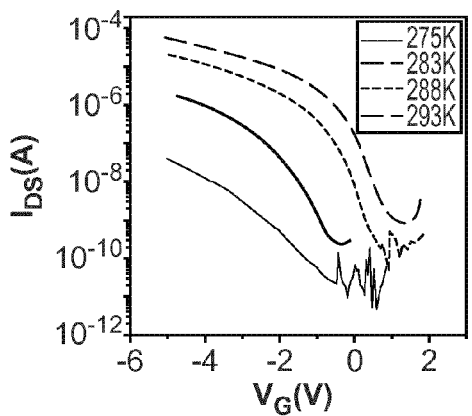
FIGS. 20A and 20B: Temperature dependence behavior of PTDPPTFT4 transistors on e-PVDF-HFP dielectric layer (about 1.4 µm). The transistors are formed with bottom-gate and top-contact Au electrodes with L=about 50 µm and W=about 1,000 µm.
Figure 20B:
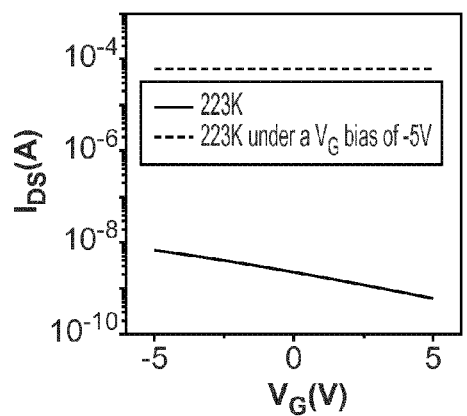

The combination of a fluorinated polar elastomer and a very low concentration of ions in e-PVDF-HFP dielectric-gated OTFTs induces a high charge carrier density through electric double-layer charging. Furthermore, evaluated transistors showed a hysteresis of about 0.5 V, with a higher back-sweep current compared to a forward sweep (FIG. 5C). The performance of a device depends on the operating temperature, with a sharp decrease in the transconductance by cooling the device from room temperature to 200 K (FIG. 5D). This decrease may be largely attributed to the ion mobility of the polymer dielectric, which directly correlates with segmental motion and depends strongly on the operating temperature (see also FIGS. 20A-20B).

Figure 6A:
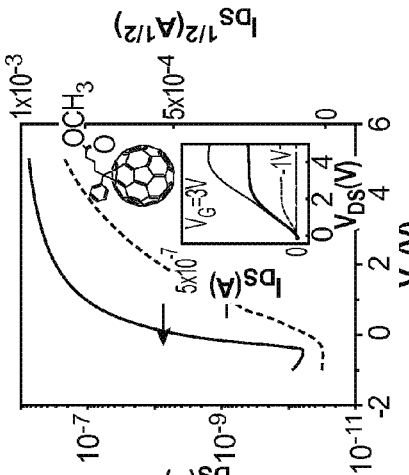
FIGS. 6A, 6B, 6C, 6D, 6E, and 6F: Electrical Characteristics of OTFTs based on e-PVDF-HFP dielectric layer with W/L=about 20. Transfer and output characteristics of the OTFTs of poly(3-hexyl thiophene) (P3HT), graphene, and phenyl-C61-butyric acid methyl ester (PCBM) in FIGS. 6A, 6B and 6C respectively. Note that the transfer characteristics of the graphene devices were evaluated in the linear-regime, where $V_{DS}$=about −0.1 V. Each panel exhibits the transfer curves with output characteristics shown in the inserted smaller figures.
Figure 6B:
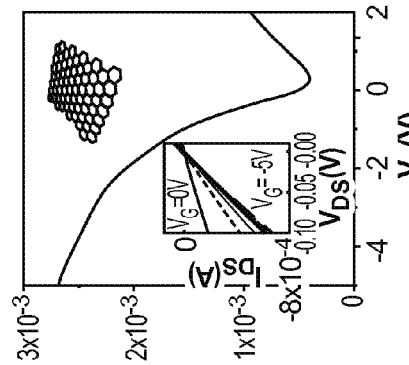
Figure 6C:
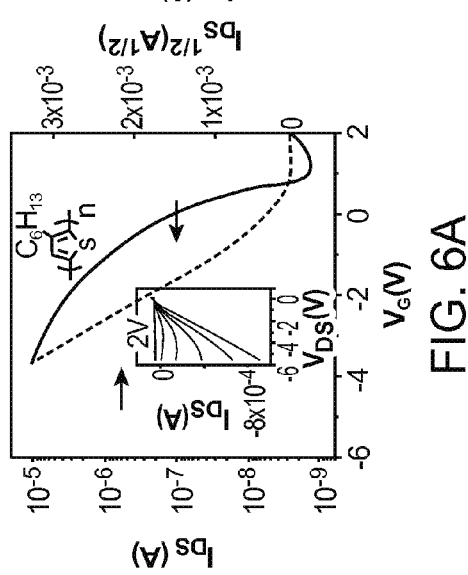
Figure 6D:
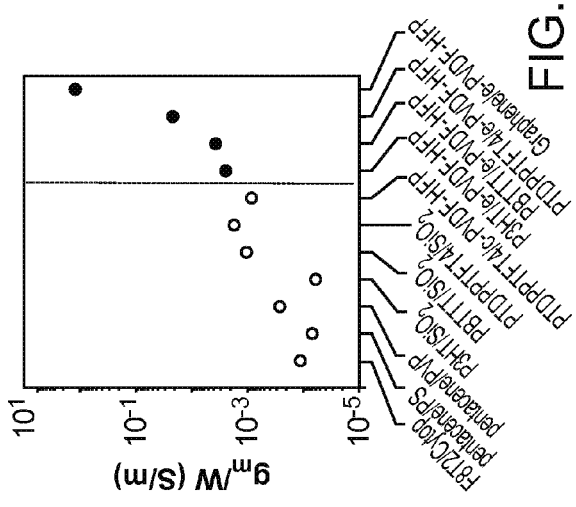
Figure 6E:
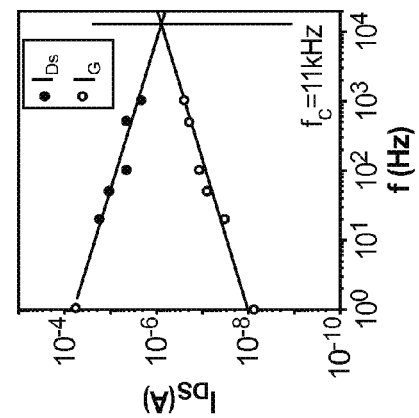
Figure 6F:
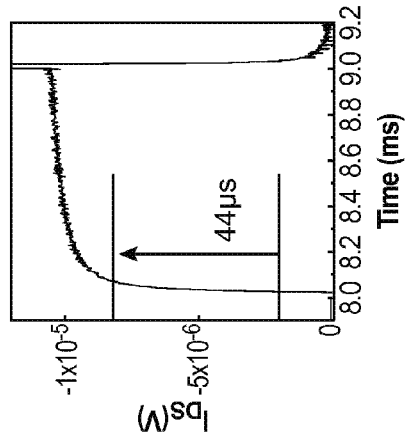

Several additional solution-processable semiconductors are tested on a thick e-PVDF-HFP dielectric layer. As shown in FIGS. 6A-6F, transistors with poly(3-hexyl thiophene) (P3HT), CVD-grown graphene, and phenyl-C61-butyric acid methyl ester (PCBM) also exhibited high transconductance. These devices generate large current outputs at low gate voltages of less than about 5 V. The transconductances per channel width of these devices were measured to be three to ten times higher than values of the corresponding material with $SiO_2$ or other reported polymer dielectrics. Intriguingly, compared to graphene devices using $SiO_2$ or a polymer gate dielectric, graphene devices formed on e-PVDF-HFP showed a Dirac point shifted to about 1 V. This may indicate that the e-PVDF-HFP dielectric surface may be substantially free of defects. Table 1 below provides a summary of OFET electrical performance characteristics measured in the saturation regime using an e-PVDF-HFP dielectric layer (thickness of about 1.4 µm). Mobility values were calculated using a quasi-static capacitance of about 300 nF cm$^{-2}$. PII2T is an isoindigo-based conjugated polymer.

parameter. The switching speeds of gel electrolyte dielectric-gated devices typically range from 1 to 100 Hz. To evaluate the switching behavior of e-PVDF-HFP-gated OFETs, a short gate voltage pulse is applied for device operation. The e-PVDF-HFP/PTDPPTFT4 transistor exhibited a switching-on response of about 44 µs (FIGS. 6E-6F). A cutoff switching frequency ($f_c$), characterizing a maximum operating frequency of a transistor, is determined to be about 11 kHz by measuring $I_{DS}$ and $I_G$ as a function of frequency, in which $f_c$ is specified as the frequency where AC modulated $I_{DS}$ is equal to the parasitic gate current ($I_G$). Intriguingly, the $f_c$ value (about 11 kHz) is comparable or even higher than many gel electrolyte devices with very high ionic concentrations, despite the ultra-low ionic concentration in e-PVDF-HFP. The lowering of $I_{DS}$ observed at higher frequencies (FIG. 6E) may be attributed to a decreased capacitance with increased frequency. In addition, the increased $I_G$ may be mainly attributed to parasitic current contributed from a large overlap between the drain/source and gate electrodes. The cutoff frequency of the device of this example is mainly constrained by a long channel length (L=about 50 µm) and the large overlap between drain/source and gate electrodes, which results in a large parasitic gate current. Therefore, the switching speed of devices may be further improved by reducing the overlap of the drain/source and gate electrodes and further modification of the gate dielectric.

Figure 7B:
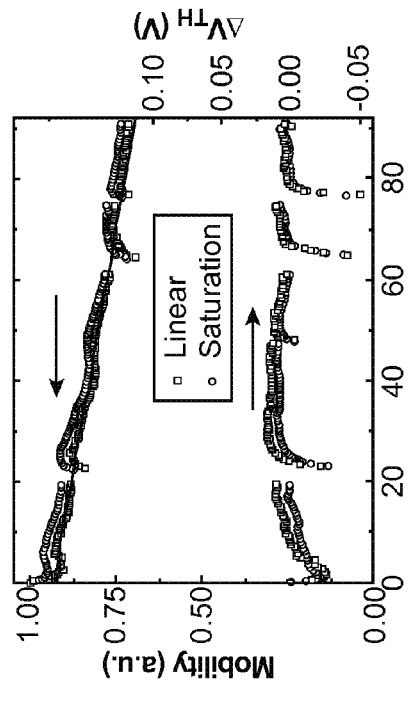
FIGS. 7A, 7B, 7C, and 7D: Bias stress analysis of e-PVDF-HFP devices with PTDPPTFT4 as the semiconductor material.
Figure 7D:
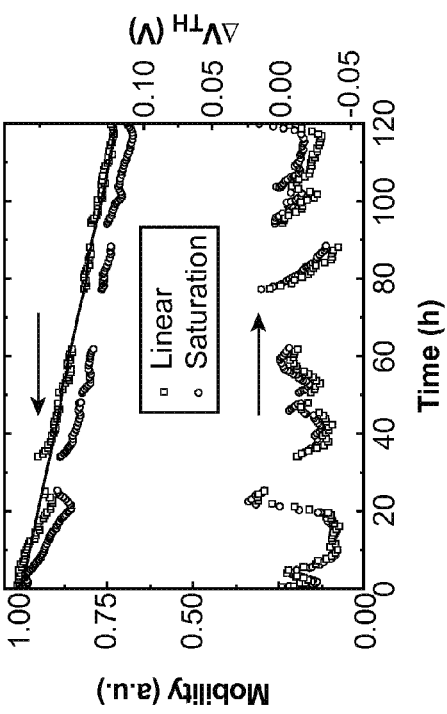
Figure 7A:
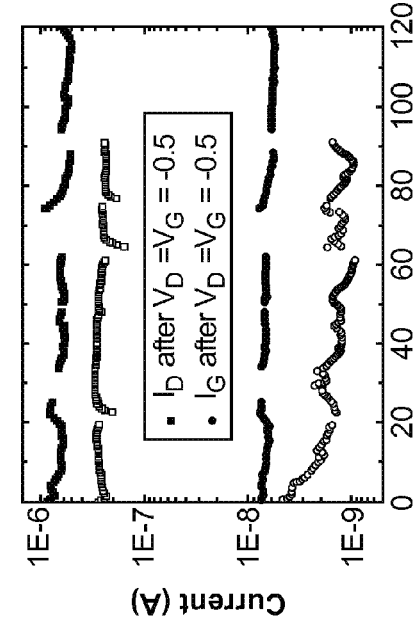
Figure 7C:
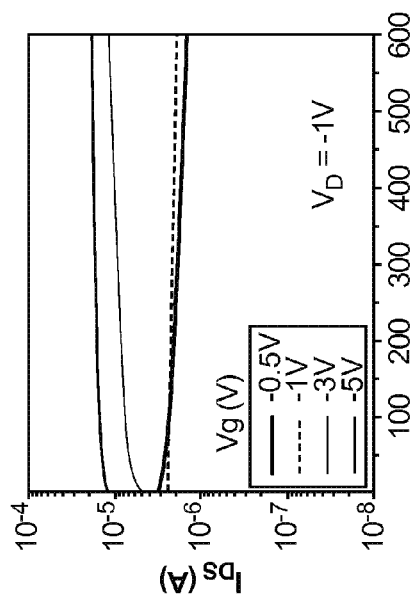

Another potential issue with OFETs is a bias stress and a device stability over time. Typical double-layer charging capacitor-based transistors are highly sensitive to humidity. Additionally, a large number of ions present in a dielectric can diffuse into a semiconductor layer and result in redox reactions and material degradation. For this purpose, e-PVDF-HFP-PTDPPTFT4 devices were analyzed in detail employing a bias period of about 10 minutes at different gate voltages under ambient conditions (FIG. 7A). Other bias stress analysis in FETs lasting for hours typically report threshold voltage shifts of at least several volts, even with fluorinated dielectrics. Low-voltage transistors typically are the most stable regarding threshold voltage shifts but also show shifts of about one volt after 27 h of bias. With the aim to obtain information about long-term stress effects in ePVDF-HFP-based devices, a bias of $V_D=V_G$=about –0.5 V was applied, and transfer characteristics were measured before and immediately after each bias step lasting for about 30 minutes. This measurement was repeated continuously

TABLE 1

| | Sample | mobility$^{MAX}$ (cm$^2$V$^{-1}$s$^{-1}$) | Mobility$^{ave}$* (cm$^2$V$^{-1}$s$^{-1}$) | on/off$^{ave}$ | $V_{TH}^{ave}$ (V) |
|---|---|---|---|---|---|
| P-channel | P3HT | 0.14 (4.86)* | 0.09 ± 0.05 (3.21 ± 1.64) | 4 × 10$^3$ | 0.01 ± 0.59 |
| | PII2T | 0.19 (7.35) | 0.17 ± 0.02 (3.52 ± 1.78) | 8 × 10$^3$ | –0.55 ± 0.08 |
| | PTDPPTFT4 | 2.11 (75.71) | 1.09 ± 0.44 (38.98 ± 15.77) | 2 × 10$^4$ | –0.67 ± 0.31 |
| | Graphene | 2181 (7.11 × 10$^4$) | 1.32 ± 0.99 × 10$^3$ (3.95 ± 2.97) × 10$^4$ | 6 | 1.08 ± 0.56 |
| N-channel | PCBM | 0.03 (1.07) | 0.02 ± 0.003 (0.82 ± 0.16) | 6 × 10$^3$ | –2.1 ± 0.4 |

*The mobilities in parentheses are extracted from LCR Meter-measured capacitance (about 8.4 nF cm$^{-2}$) at 20 Hz.

Slow response time is a potential issue for ionic dielectric-gated FETs. For practical applications, such as radio frequency identification (RFID) and organic light-emitting diodes (OLEDs), switching speed is an important device for over 120 h, with the devices exhibiting highly stable on ($I_D$) and leakage ($I_G$) currents (FIG. 7B). Interestingly, a threshold voltage ($V_{TH}$) showed a small variation of less than about ±25 mV and, importantly, no drift was observed even after 120 h. In order to evaluate device stability under aqueous media, a small hollow PDMS chamber was mounted on top of a pristine device, and de-ionized (DI) water was continuously pumped with a syringe pump for over 90 h, yielding little bias stress, stable $I_D$ and slightly decreasing leakage currents. The stability of the ePVDF-HFP dielectric was tested with devices stored under ambient conditions for more than three months, as well as devices immersed in DI water for over 24 h, both showing negligible variation in the capacitance value. Thus, this example demonstrates an OTFT driven under continuous bias with an active material directly exposed to water and exhibiting small variations of $V_{TH}$ and current output. The unprecedented device stability with direct exposure to both air and water is directly related to the high ambient and water stability of the e-PVDF-HFP dielectric, as well as the high stability of PTDPPTFT4 as an active material. These results indicate that e-PVDF-HFP provides the advantages of double-layer charging dielectrics, namely low-voltage operation and high transconductance, while maintaining an unprecedented device stability and low leakage current. This renders e-PVDF-HFP especially attractive for applications specifying high current output and sensor applications.

Table 2 below provides results on bias stress in transistors with different semiconductors and dielectrics: Threshold voltage shift $\Delta V_{TH}$; threshold voltage shift normalized by bias gate voltage $\Delta V_{TH}/V_G$; on-current $I_D$ of devices at given $V_D$ and $V_G$; cumulative bias time (Bias-time); polytriarylamine (PTAA); hexa-methyldisilazane (HMDS); poly (4-meth-oxystyrene) (PMOS); poly(4-methylstyrene) (PMS) and poly(pentafluorostyrene) (PFS).

tric layer, an unusual phenomenon in polymer dielectrics at a low ionic concentration. Results indicate there is a significant influence of electric double-layer charging on OTFT transfer characteristics even at an extremely low ionic conductivity (about $8 \times 10^{-11}$ S/cm), a value that is several orders of magnitude lower than other polymer electrolytes or ionic liquids/gels. In addition, the results demonstrate the importance of verifying a capacitance in the quasi-static limit in order to correctly characterize a charge carrier mobility. The combination of the high polarity and low $T_g$ of the elastic fluorinated polymer results in a double-layer capacitance effect, leading to the high transconductance observed in the devices. Importantly, this dielectric generally can be applicable to a variety of semiconductors beyond organic semiconductors. Due to its low cost, compatibility with standard manufacturing processes, low driving voltage and high stability in air and aqueous media, polar elastic polymer dielectrics can find value in various applications such as biomedical devices, sensors, wearable electronics and stretchable devices.

Methods:

Organic semiconductors, P3HT (from Sigma-Aldrich), PTDPPTFT4 (provided by Corning Co.) and PCBM (from Sigma-Aldrich), were used as received without further purification. PII2T was synthesized according to a previously reported procedure of Mei et al., "Siloxane-Terminated Solubilizing Side Chains: Bringing Conjugated Polymer Backbones Closer and Boosting Hole Mobilities in Thin-Film Transistors," *J. Am. Chem. Soc.*, 2011, 133 (50), pp. 20130-20133. e-PVDF-HFP was purchased from 3M Co. (3M™ Dyneon™ Fluoroelastomer FE). About 1.2 g was

TABLE 2

| Materials | $\Delta V_{TH}$ | $\Delta V_{TH}/V_G$ bias | $I_D$ | Bias $V_G$ | Bias $V_D$ | Bias-time (cumulative time) | Measurement environment |
|---|---|---|---|---|---|---|---|
| PTAA based OFETs: | | | | | | | |
| SiO$_2$/PTAA | −18 V | 0.9 | 0.15 µA @ $V_G$ = −35 V and $V_D$ = −1 V | −20 V | −2 V | 2 weeks | vacuum: P = 10$^{-5}$ mbar |
| SiO$_2$/HDMS/PTAA | | | | | | | |
| pentacene OFETs: | | | | | | | |
| PMOS/Pentacene | −13.14 V | 0.22 | 20 µA @ $V_G$ = −40 V and $V_D$ = −40 V | −60 V | 0 V | 12 h | Nitrogen |
| PMS/Pentacene | −9.28 V | 0.15 | | | | | |
| PFS/Pentacene | −5.05 V | 0.08 | | | | | |
| Low voltage pentacene OFETs: | | | | | | | |
| AlOx/Octadecylphosphonic acid/Pentacene* | −0.3 V | 0.1 | 1 µA @ $V_G$ = −3 V and $V_D$ = −1.5 V | −3 V | −3 V | 24 h | Ambient air |
| Results of this Example:** | | | | | | | |
| ePVDF-HFP/PTDPPTFT4 | +/−25 mV | 0.05 | 0.5 µA @ $V_G$ = −0.5 V and $V_D$ = −0.5 V | −0.5 V | −0.5 V | 120 h | air |
| | +/−25 mV | 0.05 | 0.3 µA @ $V_G$ = −0.5 V and $V_D$ = −0.5 V | −0.5 V | −0.5 V | 90 h | De-ionized water |

*Degradation of mobility: During the 24-hour bias stress the mobility decreased from about 0.6 cm$^2$/V s to about 0.4 cm$^2$/V s, namely about 1.4%/hour.
**Degradation of mobility was low at about 0.22%/hour and about 0.25%/hour for measurements in air and DI-water, respectively.

By way of conclusion, this example has demonstrated that the polar elastic dielectric e-PVDF-HFP significantly enhances the transconductance of OTFTs at low operating voltages, despite a dielectric layer employed being over one micron thick. The high OTFT performance is associated with the formation of an electric double-layer in the dielecdissolved in about 10 mL anhydrous 2-butone by stirring overnight under an inert atmosphere (in a nitrogen glovebox). The obtained solution was filtered through a 0.2 mm polytetrafluoroethylene (PTFE) filter and spin-coated onto highly doped n-type Si (100) (<about 0.004 Ω·cm) wafers at about 1,500 rpm for about 1 min. The spin-coated films were then dried at about 80° C. for about 10 min and subsequently cross-linked at about 180° C. for about 6 hours. Si wafers, used as substrates, were cleaned by using UV-ozone for about 20 min.

The semiconducting polymers and PCBM were spin-coated on top of the fluorinated elastomer from chlorobenzene (P3HT, about 5 mg/ml), dichlorobenzene (PII2T, about 5 mg/ml), chlorobenzene (PTDPPTFT4, about 5 mg/ml) and chloroform (PCBM, about 10 mg/ml), respectively, at about 1,000 rpm for about 1 min. These materials were then annealed for about 1 h at about 120° C. under an inert atmosphere to remove any residual solvent. Monolayer graphene films were grown on a copper (Cu) foil using chemical vapor deposition. Sequentially, the CVD-grown graphene sheets were transferred onto the e-PVDF-HFP/Si substrate for device fabrications. Gold (Au) source-drain contacts were then evaporated through a shadow mask on top of the semiconducting thin films (top contact).

Figure 19A:
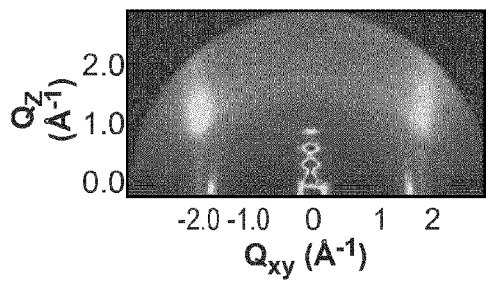
FIGS. 19A, 19B and 19C: Molecular packing of PTDPPTFT4 thin films on various dielectric surfaces.
Figure 19B:
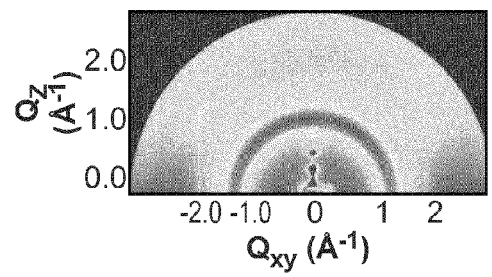
Figure 19C:
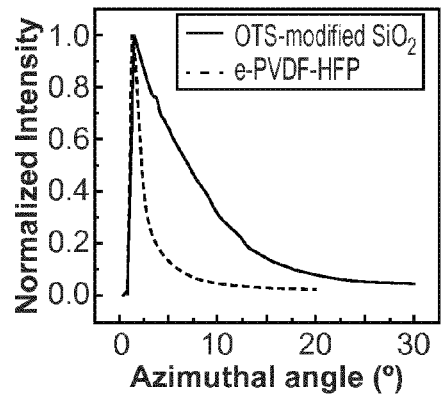

Optical micrographs were recorded with a cross-polarized optical microscope (Leica DM4000M). Thickness measurements were performed with a Dektak 150 profilometer (Veeco Metrology Group). Tapping mode atomic force microscopy was performed using a Multimode Nanoscope III (Digital Instruments/Veeco Metrology Group). Differential scanning calorimetry was realized on a TA Instruments Q2000. Grazing incidence X-ray diffraction (GIXD) experiments were performed at the Stanford Synchrotron Radiation Lightsource (SSRL) on beamline 11-3 with a photon energy of about 12.7 keV (see FIGS. 19A-19C). A two-dimensional (2D) image plate (MAR345) was used to detect diffracted X-rays. A detector was about 400 mm from a sample center. An angle of incidence was kept at about 0.08 degree, slightly below a critical angle corresponding to total reflectance to reduce a scattering background from an amorphous dielectric beneath an active layer. At an incident angle of about 0.12, diffraction peaks of the active layer was masked by the background scattering, whereas at an incident angle below about 0.08 degree, the signal from the active layer became weaker. The exposure time was about 6 min. The GIXD data was analyzed using wxDiff software.

Capacitance-voltage characteristics were performed in metal-insulator-metal (MIM) and metal-insulator-semiconductor (MIS) structures. In the MIM structure, heavily doped Si (<about 0.004 Ω·cm) and aluminum (Al) (about 100 nm) were used as bottom and top electrodes, respectively, and about 1.4 μm-thick PVDF-HFP was employed as an insulating layer. Electrode area is in the range of about 0.02 to about 0.12 cm². In the MIS structure, a semiconductor layer was deposited on an e-PVDF-HFP/doped Si substrate using the above described device fabrication conditions. Au (about 40 nm) was deposited on the semiconductor layer as a top electrode. The capacitance of the dielectrics was measured with Agilent E4980A Precision LCR and Bio-Logic VMP3 electrochemical workstation. Quasi-static capacitance measurements based on charging/discharging of RC circuits were carried out by adding an external resistor, applying a Keithley model 2400 as voltage source and a Keithley model 2635A as a voltmeter.

OTFT transfer and output characteristics were recorded in a nitrogen-filled glove box or in air by using a Keithley 4200 semiconductor parametric analyzer (Keithley Instruments, Cleveland, Ohio) (see FIGS. 12A-12E).

While this disclosure has been described with reference to the specific embodiments thereof, it should be understood by those skilled in the art that various changes may be made and equivalents may be substituted without departing from the true spirit and scope of this disclosure as defined by the appended claims. In addition, many modifications may be made to adapt a particular situation, material, composition of matter, method, operation or operations, to the objective, spirit and scope of this disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of this disclosure. Accordingly, unless specifically indicated herein, the order and grouping of the operations is not a limitation of this disclosure.

What is claimed is:

1. An electronic or optoelectronic device, comprising:
   a semiconductor layer;
   a pair of electrodes electrically coupled to the semiconductor layer; and
   a dielectric layer in contact with the semiconductor layer and including a polar elastomer,
   wherein the polar elastomer has a glass transition temperature $T_g$ that is no greater than 25° C.,
   wherein the polar elastomer includes polar monomeric units each including at least one polar group that is bonded as a side chain to a backbone structure of the polar elastomer, and the polar group includes 2 or more atoms.

2. The device of claim 1, wherein $T_g$ is no greater than 0° C.

3. The device of claim 1, wherein the polar group has an electric dipole moment of at least 0.5 Debye.

4. The device of claim 3, wherein the electric dipole moment is at least 2 Debye.

5. The device of claim 1, wherein the polar group is selected from alkyl groups substituted with at least one halogen group.

6. The device of claim 3, wherein a molar content of the polar monomeric units relative to all monomeric units included in the polar elastomer is greater than 20%.

7. The device of claim 6, wherein the molar content of the polar monomeric units is at least 40%.

8. The device of claim 1, wherein an electric polarization of the polar elastomer is no greater than 1 mC/m² in absence of an applied electric field.

9. The device of claim 1, wherein the device is a transistor, the pair of electrodes correspond to a drain electrode and a source electrode, and further comprising:
   a gate electrode, wherein the dielectric layer is disposed between the gate electrode and the semiconductor layer.

10. An electronic or optoelectronic device, comprising:
    a semiconductor layer;
    a pair of electrodes electrically coupled to the semiconductor layer; and
    a dielectric layer in contact with the semiconductor layer and including a polar fluorinated elastomer,
    wherein the polar fluorinated elastomer includes ions and has an ionic conductivity no greater than $1 \times 10^{-6}$ S/cm.

11. The device of claim 10, wherein the ionic conductivity is at least $1 \times 10^{-12}$ S/cm and up to $1 \times 10^{-7}$ S/cm.

12. The device of claim 10, wherein a weight percentage of the ions included in the polar fluorinated elastomer is no greater than 5% by weight.

13. The device of claim 10, wherein the ions include organic cations.

14. The device of claim 10, wherein the ions include phosphonium cations.

15. The device of claim 10, wherein the device is a transistor, the pair of electrodes correspond to a drain electrode and a source electrode, and further comprising:
   a gate electrode, wherein the dielectric layer is disposed between the gate electrode and the semiconductor layer.

16. The device of claim 15, wherein a thickness of the dielectric layer is at least 500 nm.

17. The device of claim 10, wherein the polar fluorinated elastomer has a glass transition temperature $T_g$ that is no greater than 25° C.

18. A transistor, comprising:
   a semiconductor layer;
   a drain electrode electrically coupled to the semiconductor layer;
   a source electrode electrically coupled to the semiconductor layer;
   a gate electrode; and
   a gate dielectric layer,
   wherein the gate dielectric layer is disposed between the gate electrode and the semiconductor layer, and the gate dielectric layer includes a polar elastomer having a glass transition temperature $T_g$ that is no greater than 25° C. and having an ionic conductivity of at least $1\times10^{-12}$ S/cm and up to $1\times10^{-6}$ S/cm.

19. The transistor of claim 18, wherein the gate dielectric layer is in contact with the semiconductor layer, and a thickness of the gate dielectric layer is at least 500 nm.

\* \* \* \* \*